US006417914B1

(12) United States Patent
Li

(10) Patent No.: US 6,417,914 B1
(45) Date of Patent: Jul. 9, 2002

(54) STAGE DEVICE AND EXPOSURE APPARATUS

(75) Inventor: Shiwen Li, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/690,728

(22) Filed: Oct. 18, 2000

(30) Foreign Application Priority Data

Oct. 18, 1999 (JP) .......................................... 11-294890

(51) Int. Cl.[7] .................. G03B 27/58; G03B 27/42; H02K 41/00
(52) U.S. Cl. ...................... 355/75; 355/72; 355/53; 310/12
(58) Field of Search ............................. 355/53, 72–76; 310/12–13; 318/568.17, 648–649; 378/34

(56) References Cited

U.S. PATENT DOCUMENTS

| 5,208,497 A | * | 5/1993 | Ishii et al. ................... 310/12 |
| 5,504,407 A | * | 4/1996 | Wakui et al. ............ 318/568.17 |
| 5,815,246 A | | 9/1998 | Sperling et al. ............... 355/53 |
| 5,877,845 A | * | 3/1999 | Makinouchi ................. 355/53 |
| 5,909,272 A | * | 6/1999 | Osanai et al. ................. 355/53 |
| 5,969,441 A | * | 10/1999 | Loopstra et al. ............... 310/12 |
| 6,107,703 A | * | 8/2000 | Korenaga ..................... 310/12 |
| 6,246,204 B1 | * | 6/2001 | Ebihara et al. .............. 318/649 |
| 6,262,794 B1 | * | 7/2001 | Miyajima ..................... 355/53 |
| 6,262,796 B1 | | 7/2001 | Loopstra et al. ............... 355/53 |

FOREIGN PATENT DOCUMENTS

JP 3-21894 1/1991

* cited by examiner

Primary Examiner—Russell Adams
Assistant Examiner—Hung Henry Nguyen
(74) Attorney, Agent, or Firm—Oblon, Spivak, McClelland, Maier & Neustadt, P.C.

(57) ABSTRACT

The shift in the center of gravity of a stage device and the reaction force caused when at least one of a first and second stage devices move, are canceled out by moving a moving member. The shift in the center of gravity of a stage device and the reaction force caused when the stage devices move that cannot be canceled out by moving the moving member, are completely canceled out by moving a base. That is, even if at least one of the first and second stages move, the center of gravity of the stage device does not move, and the reaction force are reliably canceled. Accordingly, by concurrently performing exposure on the two substrates mounted on the first and second stages, the exposure throughput can be improved, and an exposure with a high precision can be performed.

21 Claims, 11 Drawing Sheets

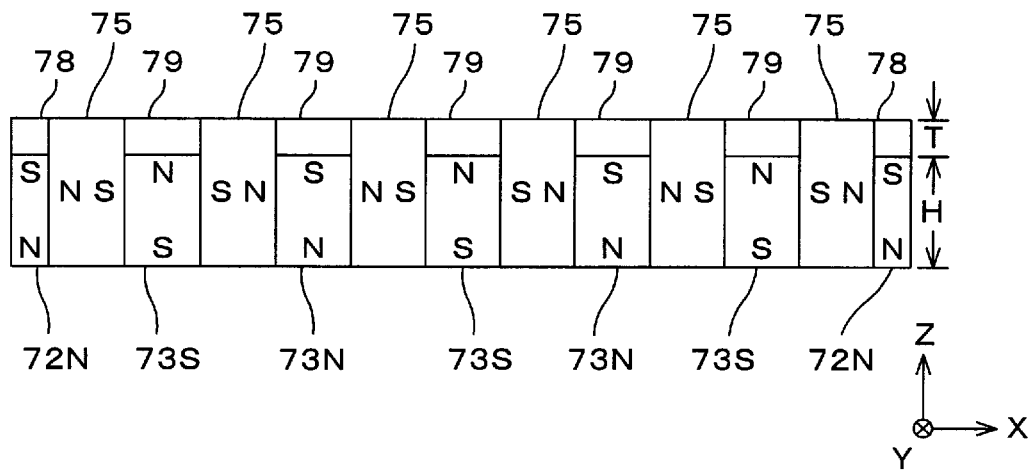
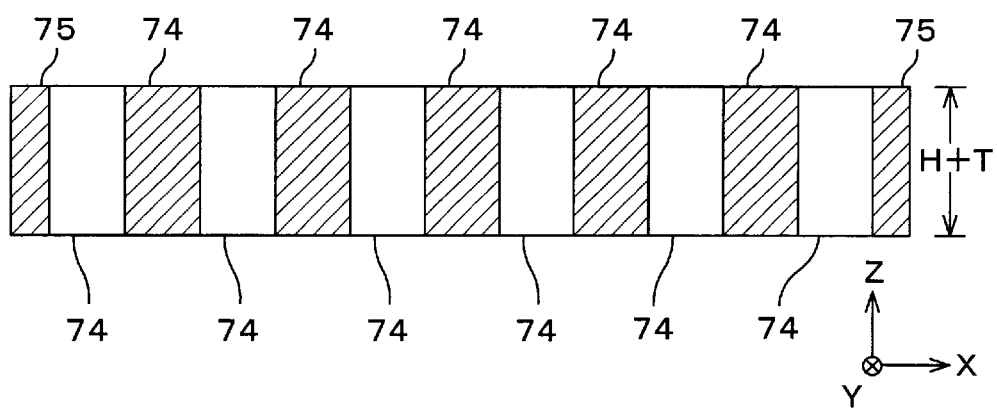
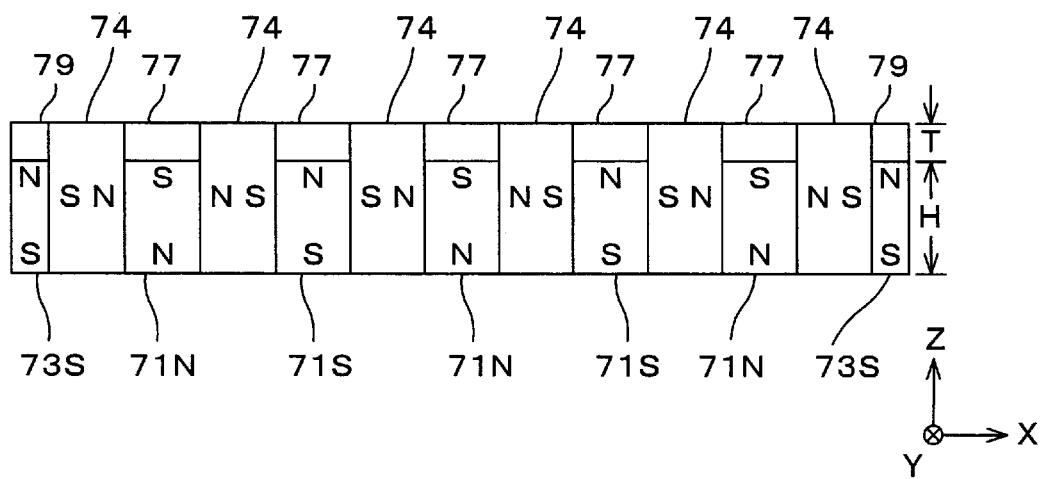

Fig. 9A
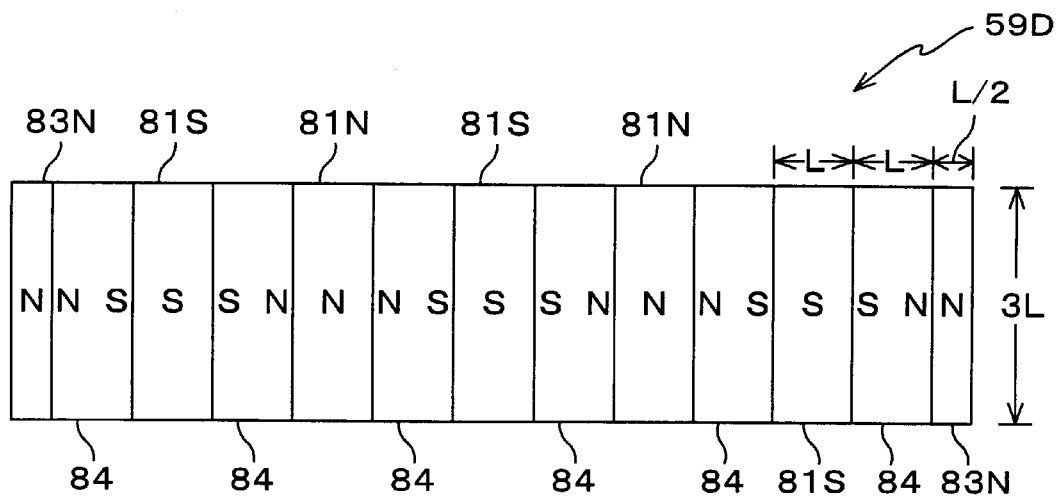
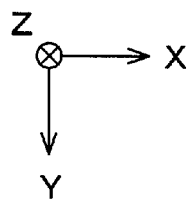
Fig. 9B
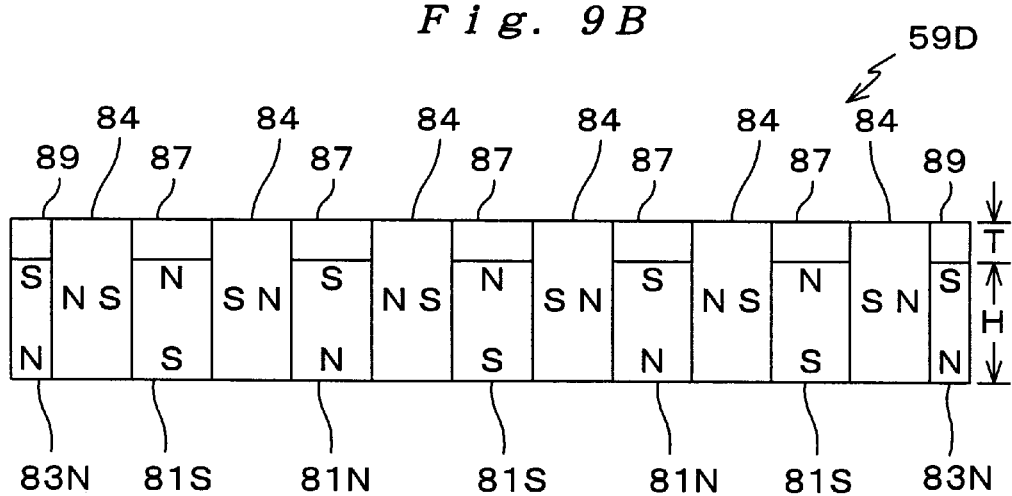
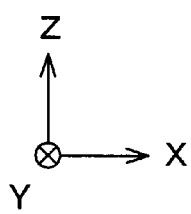

STAGE DEVICE AND EXPOSURE APPARATUS

BACKGROUND OF THE INVENTION

1. Field of the Invention

The present invention relates to a stage device and an exposure apparatus. More particularly, the present invention relates to a stage device including two stages, which hold two objects, and an exposure apparatus, which includes the stage device.

2. Description of the Related Art

Conventionally, in a lithographic process to manufacture devices such as semiconductors and liquid crystal displays, various types of exposure apparatus have been used to transfer patterns formed on a mask or a reticle (to be generically referred to as a "reticle" hereinafter) onto a substrate such as a wafer or a glass plate (to be generically referred to as a "wafer" hereinafter) coated with a resist or the like. In recent years, a projection exposure apparatus based on a step-and-repeat method (a so-called stepper) and a scanning type projection exposure apparatus based on a step-and-scan method (a so-called scanning stepper) have been mainly used.

With an exposure apparatus such as the stepper, since the wafer must be accurately positioned to a projection position of a reticle pattern, the wafer is held on a wafer holder by vacuum chucking, and the wafer holder is fixed on a wafer table.

In the process performed by the exposure apparatus such as the stepper, after the wafer loading process to load a wafer onto the wafer stage by using the wafer loader, the alignment process to measure the position of each shot area on the wafer is performed. This alignment process, in general, includes: the search alignment process which is performed based on the outer shape of a wafer or by detecting search alignment marks on the wafer; and the fine alignment process which is performed following the search alignment process to accurately obtain the position of each shot area on the wafer. For this fine alignment process, the EGA (Enhanced Global Alignment) method disclosed in, for example, U.S. Pat. Nos. 4,780,617 and 4,962,318 is used. With this method, a plurality of sample shots within a wafer are selected in advance, and the position of alignment marks (wafer marks) with respect to the sample shots are sequentially measured. The array data of all the shots on the wafer are then obtained by performing statistical calculation based on a so-called least-squares method based on the measurement results and the shot array designed values. According to this method, the coordinate position of each shot area can be obtained relatively accurately with a high throughput.

Next, the respective shot areas on the wafer are sequentially positioned based on the coordinate positions of the respective shot areas obtained by the EGA method or the like and a baseline amount measured in advance. Then, the exposure process is performed to transfer the reticle pattern image onto the wafer through the projection optical system. After the exposure process, the wafer unloading process to unload the wafer having completed exposure from the wafer stage by using the wafer unloader is performed. The wafer unloading process constitutes the wafer exchanging process, along with the wafer loading process in which the wafer is exposed. The exposure apparatus, when focusing on each wafer, sequentially repeats three main operations, i.e., wafer exchange, alignment, and exposure. In the case the exposure apparatus performs these process by using one wafer table, $T_T$ is the processing time per wafer, $T_1$ is the wafer exchange time, $T_2$ is the alignment time, and $T_3$ is exposure time, therefore:

$$T_T = T_1 + T_2 + T_3 \tag{1}$$

The wafer exchange time $T_1$ is shorter than the alignment time $T_2$ and exposure time $T_3$. Most of the processing time $T_T$ per wafer is taken up by the alignment $T_2$ and exposure time $T_3$.

Exposure apparatus such as steppers are apparatus that mass-produce semiconductor devices and the like, therefore inevitably require an improvement in productivity (throughput). In order to meet such a requirement, an exposure apparatus which concurrently performs the alignment and exposure process by using two substrate tables, while incorporating resources to independently drive the tables, has been proposed in, for example, Japan Patent Laid Open No. 10-214783 (to be referred to as a "prior art" hereinafter). with this apparatus, the processing time $T_T{}'$ is as follows:

$$T_T{}' = \mathrm{MAX}[T_1 + T_2, T_3] \tag{2}$$

That is, the throughput greatly improves compared with the case in which only one substrate table is used.

Recently, when producing semiconductor devices, in order to improve the productivity, the size of the wafer tends to gradually increase from 6 inches to 8 and 12 inches. And the wafer stage, which has also increased in size, requires to be driven with a higher speed. That is, as the wafer stage increases in weight, the driving force of the wafer stage needs to be further increased. An increase in the weight of the wafer stage causes the center of gravity to move more frequently in a stage device including the wafer stage, along with the movement of the wafer stage. This causes the exposure apparatus including the stage device to lose its stability, and will lead to deformation of the exposure apparatus. Also, for example, when the wafer stage performs reciprocal movements, vibration is caused in the overall exposure apparatus.

And, if the wafer stage is driven with a large force, the reaction force causes the overall exposure apparatus to deform or to vibrate.

Further, the above conventional technique is an excellent technique to improve the throughput. However, when considering the increase in the size and weight of each wafer stage, and the two wafer stages being independently driven with large driving forces corresponding to the respective stages, the exposure apparatus may further deform and vibrate compared to the exposure apparatus with one wafer stage.

As the degree of integration of semiconductor devices increases, the device rule (practical minimum line width) decreases every year, and an improvement in pattern transfer precision is thus required. In spite of such a requirement for an improvement in pattern transfer precision, the above deformation and vibration of the exposure apparatus act as factors that cause a deterioration in pattern transfer precision. In other words, it is becoming difficult to satisfy both the requirements for an improvement in pattern transfer precision and an improvement in throughput.

SUMMARY OF THE INVENTION

The present invention has been made in consideration of this situation, and has as its first object to provide a new stage device which independently drives two stages, while reducing the influence of the center of gravity shifting caused by the stages being driven and vibration caused by the reaction force.

It is the second object of the present invention to provide an exposure apparatus that can improve the throughput while improving the precision of pattern transfer.

According to the first aspect of the present invention, there is provided a stage device comprising: a first and second stage movably supported on a base; and a moving member which is movably supported on the base and moves to cancel out a shift in a center of gravity of the stage device when at least one of the first and second stages move. The term "canceling out a shift in a center of gravity" includes completely canceling out a shift in the center of gravity as well as partially canceling out a shift in the center of gravity, i.e., reducing the amount of the center of gravity position moving.

According to this arrangement, the center of the gravity of the stage device moves when at least one of the first and second stage moves. However, this is canceled out by moving the moving member. That is, the shift in the center of gravity of the stage device when at least one of the first and second stage moves can be prevented. This makes it possible to prevent the external members from losing stability when compared with the initial state of the stage device.

The stage device of the present invention can further comprise a base supporting member which movably supports the base. In this case, the shift in the center of gravity of the stage device, which cannot be completely canceled out by moving the moving member, can be completely canceled out by moving the base.

With the stage device of the present invention, on driving the first stage, second stage, or moving member, the device can be structured so that the first stage, second stage or moving member is driven with respect to the base. And the reaction force generated by the driving acts on the base. In this case, the base can be structured so that it moves on the base supporting member by a resultant of forces of a reaction force generated when at least one of the first and second stage moves, and a reaction force generated when the moving member moves. With this arrangement, the friction between the base and the base support member is reduced, thus preventing the shift in the center of gravity of the stage device.

The stage device of the present invention can further comprise a structure of a plurality of mass bodies capable of moving independently. In such a case, by adjusting the movement of the plurality of mass bodies according to the movement of the first or second stage, the shift in the center of gravity of the stage device can be canceled out. Also, if the stage device is structured so that the reaction force is to act on the base when the first stage, second stage, or moving member is driven, the sum of reaction forces acting on the base can be reduced to almost 0. This can be achieved, by adjusting the driving force of the plurality of mass bodies in consideration of the driving force of the first stage or second stage and its positional relationship with the base, and positional relationship between the plurality of mass bodies and the base.

If friction between the first stage, the second stage, and the respective plurality of mass bodies and the base is sufficiently small, the shift in the center of gravity of the stage device and the reaction force acting on the base can be cancelled all at once. As a method to support the first stage and second stage and the plurality of mass bodies with a base, by a sufficiently small frictional force, a method such as an air levitation method or a magnetic levitation method is available.

In the case the first and second stages and the plurality of mass bodies move two-dimensionally along a predetermined moving plane, and the respective mass bodies can be driven in any two-dimensional directions, the shift in the center of gravity of the stage device can be canceled out when the number of mass bodies is two or more. Also, in the case the base is structured so that the reaction force act when driving the first stage, the second stage, or the moving member, the sum of reaction forces acting as a two-dimensional translation force in a direction parallel to a predetermined moving plane or two-dimensional rotational forces can be reduced to almost 0. In addition, if the reaction force acting on the base when driving the first stage, second stage, and the plurality of mass bodies are flush, the sum of reaction forces including three-dimensional rotational forces can be reduced to 0.

Also, when the first stage, the second stage, and the plurality of mass bodies move along a predetermined moving plane two-dimensionally, and the plurality of mass bodies are driven in directions which are not all parallel to one another, if three or more mass bodies are used, then the shift in the center of gravity of the stage device can be canceled out. And, in the case the base is structured so that the reaction force act when driving the first stage, the second stage, or the moving member, the sum of reaction forces acting as a two-dimensional translation force in a direction parallel to a predetermined moving plane or two-dimensional rotational forces can be reduced to almost 0. In addition, if the reaction force acting on the base when driving the first stage, second stage, and the plurality of mass bodies are flush, the sum of reaction forces including three-dimensional rotational forces can be reduced to 0.

The stage device of the present invention can have the structure of further comprising a first driving unit which includes a first mover fixed to the first stage and a first stator fixed to the base, the first driving unit driving the first mover by electromagnetic interaction; and a second driving unit which includes a second mover fixed to the second stage and a second stator fixed to the base, the second driving unit driving the second mover by electromagnetic interaction. In such a case, the first stage and the second stage can be moved at a high speed with high controllability. In the case planar motors are used as the first driving unit and second driving unit, the first stator and second stator can be integrated into one unit.

The stage device of the present invention can further comprise a third driving unit which includes a third mover fixed to the moving member and a third stator fixed to the base, the third driving unit driving the third mover by electromagnetic interaction. In such a case, the moving member can be controlled at a high speed with high controllability. If the moving member includes a plurality of mass bodies which can be independently driven, the third mover includes movers equal in number to the mass bodies, and the second stators include stators equal in number to the mass bodies. In the case a planar motor is used as the third driving unit. In this case, even if the moving member includes a plurality of mass bodies which can be independently driven, all the stators can be of an integrated structure.

Furthermore, in the case planar motors are used as the first, second, and third driving units, the first, second, and third stators can be of an integrated structure. In such a case, the reaction force acting on the base when driving the first, second, and third stages can be made to be a force acting on the same plane.

According to the second aspect of the present invention, there is provided an exposure apparatus to transfer a predetermined pattern onto a substrate by exposing the substrate with an energy beam, the exposure apparatus comprising a stage device according to the present invention as a substrate stage device to hold the substrate.

With this apparatus, the pattern is transferred onto the substrate while the substrate is held and moved by the stage device in the present invention. Therefore, deformation and vibrations of the exposure apparatus that occur when the center of gravity of the stage device shifts can be prevented while meeting the requirements for large-sized substrates. Accordingly, the throughput can be improved while improving the precision of pattern transfer. Also, since the substrates can be respectively held and moved independently on the first and second stages of the stage device of the present invention, two substrates can be concurrently processed with the exposure apparatus, thus improving the throughput.

The exposure apparatus of the present invention can have the structure of further comprising: an exposure main body portion to transfer the predetermined pattern by irradiating one of a first and second substrate held on the first and second stage with the energy beam on exposure; an alignment portion to detect array coordinates of a divided area formed on a surface of a remaining of the first and second substrate; a first position detection device to detect a position of the first stage; and a second position detection device to detect a position of the second stage, and the one of the first and second stage is positioned to a transferring position of the predetermined pattern, and the remaining of the first and second stages is positioned with respect to the alignment portion. In such a case, the exposure apparatus can perform the exposure process on the first substrate, while concurrently performing the alignment process of detecting the array coordinates of a divided area formed on the surface of the other substrate. In the exposure process, one substrate is positioned with respect to the main body portion for exposure based on the detection result of the first stage position obtained by the first position detection device, and the pattern is transferred. Meanwhile, in the alignment process, the other remaining substrate is positioned with respect to the alignment portion to detect the arrangement coordinates of the divided areas formed on the surface of the substrate, based on the detection result of the second stage position obtained by the second position detection device. Accordingly, the throughput of the exposure apparatus can be greatly improved while improving the precision of the pattern transfer.

It is preferable for the exposure apparatus to further comprise a detection device to detect the positions of the moving members of the stage device. In such a case, the shift in the center of gravity of the stage device can be accurately canceled out. Also, if the controlled variable to drive the moving members change in accordance with their position, by controlling and driving the moving members based on their position, they can be driven in a desired form.

In this case, the first position detection device can be structured so as to comprise: a first optical member fixed to the first stage; and a first interferometer system to detect the position of the first stage by irradiating the first optical member with light and receiving reflected light from the first optical member, and the second position detection device can comprise: a second optical member fixed to the second stage; and a second interferometer system to detect the position of the second stage by irradiating the second optical member with light and receiving reflected light from the second optical member. In such a case, the position of the first stage (i.e., the position of the first substrate) and the position of the second stage (i.e., the position of the second substrate) can be detected with extreme accuracy by the first and second interferometer systems. This makes it possible to transfer a pattern with high precision.

An interferometer system is preferably used, also to detect the position of the moving members. In such a case, the shift in the center of gravity can be canceled out very accurately. Also, if the controlled variable to drive the moving members change in accordance with their position, by controlling and driving the moving members based on their position, the moving members can be driven with an extremely high accuracy.

In the exposure apparatus of the present invention, the exposure main body portion can be structured to comprise: a mask stage device to hold and move a mask on which the predetermined pattern is formed and which is irradiated with the energy beam; and a projection optical system to image-form the predetermined pattern with the energy beam via the mask. In such a case, the pattern formed on the mask can be transferred onto the substrate with higher precision and throughput.

The mask stage device can be structured to comprise: a mask stage to hold and move the mask; and a mask stage base which movably holds the mask stage, the mask stage base moves by a reaction force generated when the mask stage moves. In this case, the movement of the mask stage base cancels out the shift in the center of gravity of the mask stage device when the mask stage moves to move a mask. Accordingly, this prevents deformation and vibration of the exposure apparatus when a mask is moved, and allows the mask to be moved at a high speed. Thus, the pattern formed on the mask can be transferred onto the substrate with a higher precision and throughput.

According to the third aspect of the present invention, there is provided a scanning exposure apparatus comprising: a mask stage device which has a fine adjustment stage and a coarse adjustment stage to hold a mask, the stage device moves the mask; a substrate stage device which is separated from the coarse adjustment stage and include a first substrate stage to hold and move a first substrate, and a second substrate stage to hold and move a second substrate, and a projection optical system which is separated from the coarse adjustment stage and the substrate stage device and projects a pattern of the mask onto one of the first and second substrate stage.

According to this apparatus, the mask on the mask stage device and one of the first and second substrates are synchronously moved while the mask is irradiated with an exposure beam. In this case, the mask is moved by the mask stage, whereas, one of the first and second substrates is moved by the substrate stage device. Such movement of the mask and substrate can cause reaction force from the driving force, which may affect other portions of the exposure apparatus in the form of vibrations. Or, it can cause the center of gravity of the mask stage and substrate stage to move, which in turn may cause a deformation of the apparatus. However, the coarse adjustment stage, the substrate stage device, and the projection optical system are arranged separately from one another, and are substantially free from the influence of vibrations or the like when the mask or substrate are driven at other portions. Consequently, patterns can be transferred with high precision. Also, since this apparatus has two substrate stages, i.e., the first substrate stage and the second substrate stage, various processes can be performed concurrently on the two substrates, thus improving the throughput in exposure.

With the scanning exposure apparatus of the present invention, the apparatus can have the structure of further comprising a substrate stage reaction force suppressing device to suppress a reaction force generated when at least one of the first and second stage moves. In such a case, vibration caused by the reaction force due to the movement of at least one of the first and second substrate stages can be suppressed, and kept from traveling to other portions of the exposure apparatus, therefore the pattern can be transferred with high precision.

With the scanning exposure apparatus of the present invention, the apparatus can have the structure of further comprising a suppressing device to keep a center of gravity of the substrate stage from moving which occurs when at least one of the first and second stage moves. In such a case, deformation or vibration due to the shift in the center of gravity of the substrate stage device caused by the reaction force generated when at least one of the first and second substrate stages moves can be suppressed, thus the pattern can be transferred with high precision.

According to the scanning exposure apparatus of the present invention, it can have the structure of further comprising a mask stage reaction force processing device to suppress a reaction force generated when at least one the fine adjustment stage and the coarse adjustment stage moves. In such a case, vibration caused by the reaction force generated when at least one of the fine adjustment stage and coarse adjustment stage moves can be suppressed from travelling to other portions of the exposure apparatus, therefore, the pattern can be transferred with high precision.

According to the scanning exposure apparatus of the present invention, it can have the structure of further comprising a suppressing device to keep a center of gravity of the mask stage device moving which occurs when at least one of the fine alignment stage and the coarse adjustment stage moves. In such a case, deformation or vibration due to the shift in the center of gravity of the mask stage device caused by the reaction force generated when at least one of the fine adjustment stage and coarse adjustment stage moves can be suppressed. The pattern, therefore, can be transferred with high precision.

The scanning exposure apparatus of the present invention can have the structure of further comprising a fine adjustment stage driving unit which is arranged between the fine adjustment stage and the coarse adjustment stage, the driving unit drives the fine adjustment stage. In such a case, the reaction force caused when driving the fine adjustment stage by the fine adjustment stage driving unit act on the coarse adjustment stage. However, since the coarse adjustment stage is separated from the substrate stage device and the projection optical system, vibration and the like caused by the reaction force acting on the coarse adjustment stage can be suppressed from travelling to the substrate stage device and projection optical system. Also, by adjusting the position of the fine adjustment stage the position of the mask is accurately controlled. Therefore, the pattern can be transferred with high precision.

With the scanning exposure apparatus of the present invention, it can have the structure of further comprising: a first alignment device to perform alignment of the first substrate; and a second alignment device to perform alignment of the second substrate. In such a case, while one substrate is held on one of the first and second substrate stages and subject to scanning exposure with an exposure beam through the projection optical system on scanning exposure, the other substrate held on the other substrate stage can be aligned. That is, scanning exposure of one substrate and alignment of the other substrate can be concurrently performed. Accordingly, the throughput of substrate exposure can be improved to, around double, at a maximum.

This apparatus can have the structure of further comprising a holding member to hold the projection optical system, the first alignment device, and the second alignment device. In such a case, as with the projection optical system, since the first and second alignment devices are separated from the coarse adjustment stage and substrate stage device, these devices are substantially free from the influence of vibration caused when the mask or the substrate is moved. This, therefore, makes it possible to perform alignment and pattern transfer with high precision.

BRIEF DESCRIPTION OF THE DRAWINGS

FIGS. 7A to 7C are views to explain the arrangement of the magnetic pole unit of the mover for the wafer stage;

FIGS. 9A and 9B are views to explain the arrangement of a magnetic pole unit for a mover for a moving member;

DESCRIPTION OF THE PREFERRED EMBODIMENTS

Figure 1:
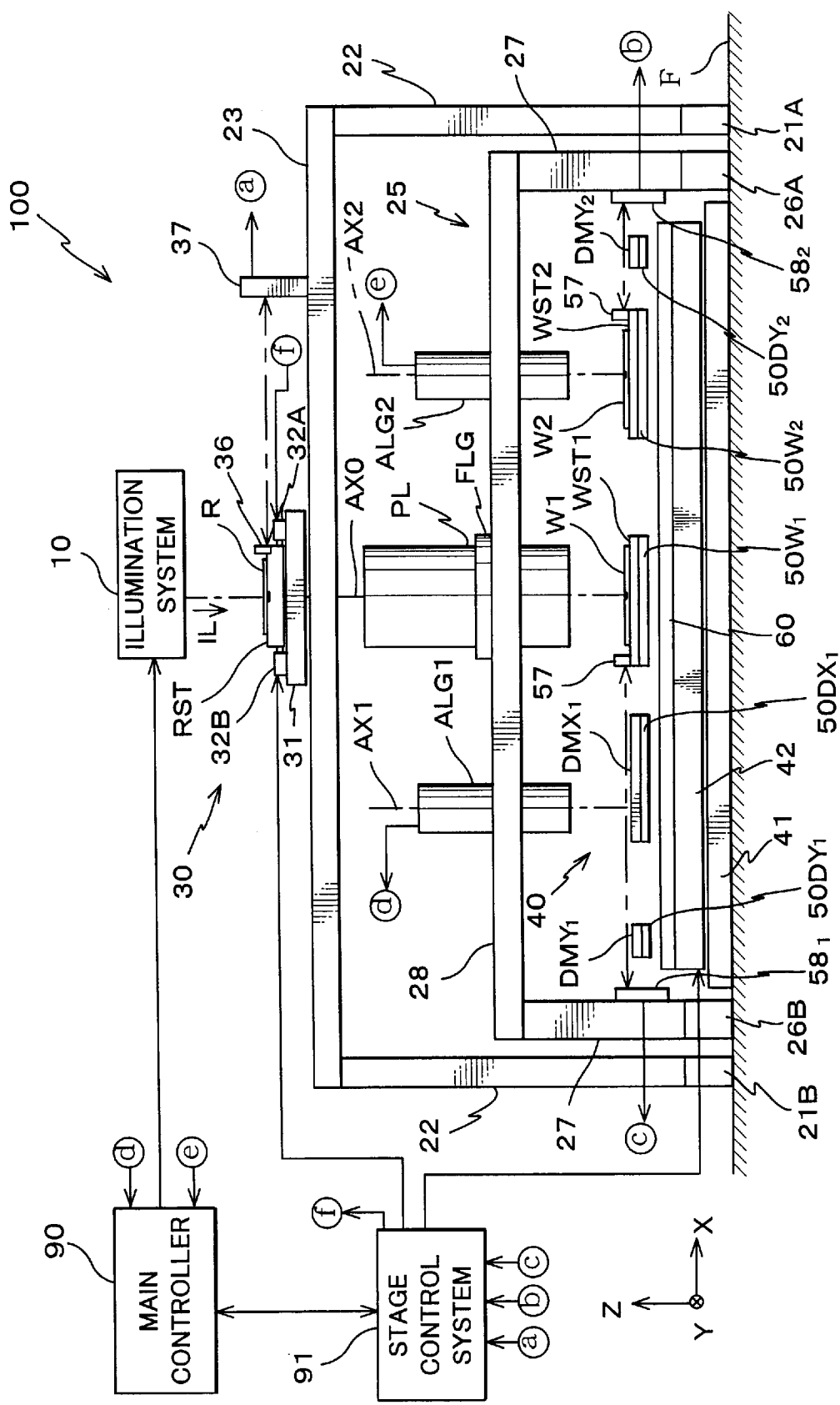
FIG. 1 is a view showing the schematic arrangement of an exposure apparatus according to an embodiment.

An embodiment of the present invention will be described below with reference to FIGS. 1 to 11. FIG. 1 schematically shows the overall arrangement of an exposure apparatus 100 according to an embodiment. The exposure apparatus 100 is a scanning exposure apparatus based on a so-called step-and-scan exposure method.

The exposure apparatus 100 comprises an illumination system 10, a reticle stage device 30 including a reticle stage RST serving as a mask stage to hold a reticle R as a mask, a projection optical system PL, a wafer stage device 40 serving as a stage device including wafer stages WST1 and WST2 as two stages to respectively hold wafers W1 and W2 and move them two-dimensionally in the X and Y directions within the X-Y plane, two alignment detection systems ALG1 and ALG2 serving as alignment sections (first and second alignment devices) to respectively detect wafer alignment marks formed on the wafers W1 and W2, and a control system for these components and the like. The illumination system 10, the reticle stage device 30, and the projection optical system PL constitute the main body of the exposure apparatus.

The illumination system 10 is made up of a light source unit, a shutter, a secondary light source forming optical system, a beam splitter, a condenser lens system, a reticle blind, an imaging lens system, an optical path bending mirror, and the like (none of which are shown). The illumination system 10 emits exposure illumination light IL, which has an almost uniform illuminance distribution. This illumination light IL illuminates a rectangular (or arcuated) illumination area on the reticle R with a uniform illuminance. In this case, as a light source of the illumination light for exposure, for example, an ultra-high pressure mercury lamp to emit an emission line (g-line or i-line) in the ultraviolet range, a KrF excimer laser light source (oscillation wavelength: 248 nm), an ArF excimer laser light source (oscillation wavelength: 193 nm), an $F_2$ light source (oscillation wavelength: 157 nm), a $Kr_2$ (krypton dimer) laser light source (oscillation wavelength: 146 nm), an $Ar_2$ (argon dimer) laser light source (oscillation wavelength: 126 nm), a metal vapor laser light source, or a YAG laser which is a harmonic generator can be used.

Figure 2:
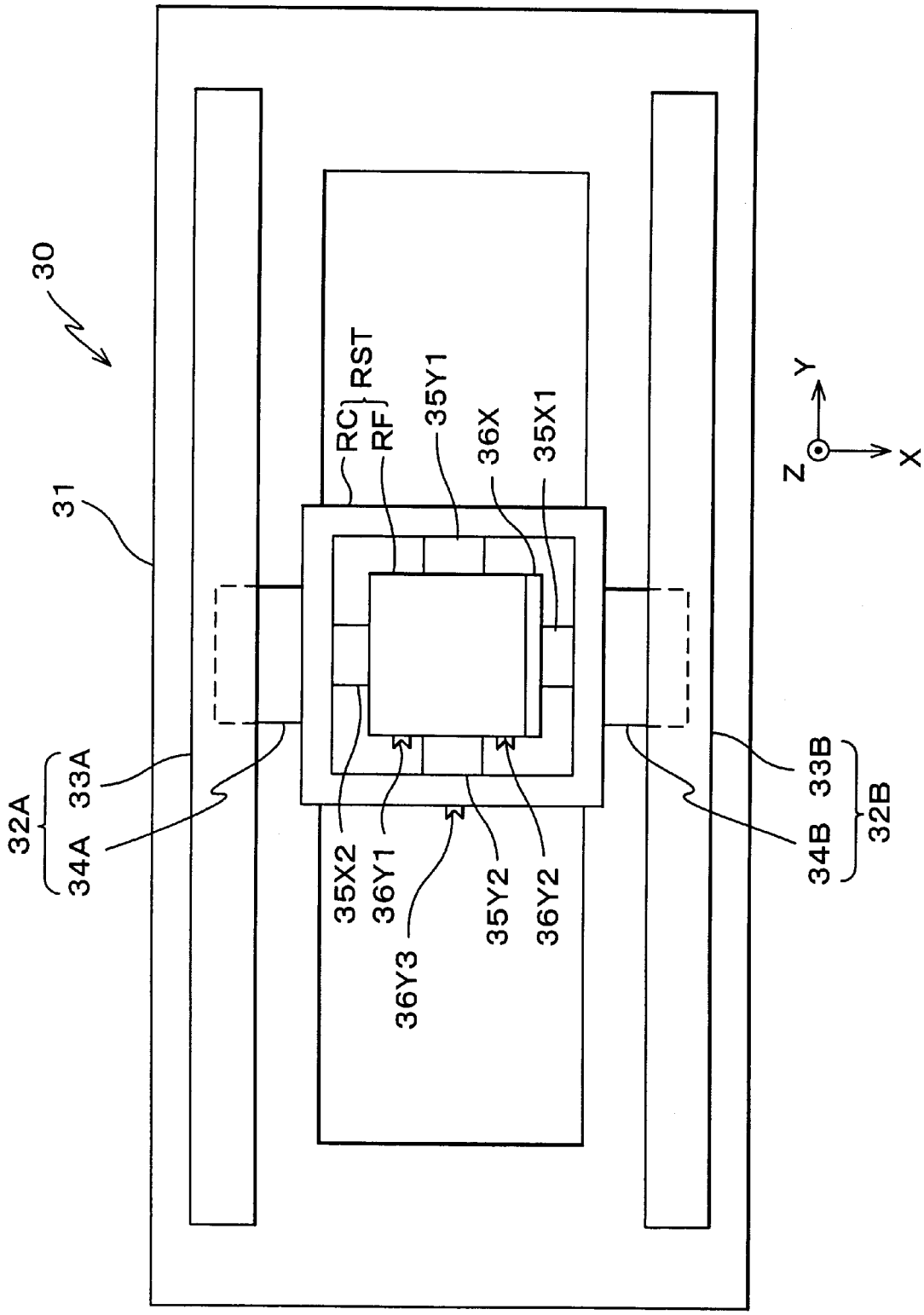
FIG. 2 is a planar view to explain the arrangement of a reticle stage device in FIG. 1.

The reticle stage device 30 includes a reticle base 31 that is rectangular in a planar view (see FIG. 2). It also includes a pair of linear motors 32A and 32B that are disposed on the upper surface of the reticle base 31 to drive the reticle stage RST in the Y-axis direction.

The reticle base 31 is horizontally supported on a base support plate 23 which is horizontally held by four pillars 22 provided upright on a floor F via a plurality of (four in this case) vibration isolating units 21A, 21B, 21C, and 21D (the vibration isolating units 21C and 21D located on the back side of the drawing of FIG. 1 are not shown). Air pads (not shown) are arranged on the lower surface of the reticle base 31, and the reticle base 31 is supported by air levitation above the base support plate 23 in a non-contacting state. As the vibration isolating units 21A, 21B, 21C, and 21D, for example, so-called active vibration isolating devices which actively control vibration on the basis of vibration sensors such as semiconductor accelerometers or the like fixed on the pillars 22 or base support plate 23 are used. Thus, fine vibration transmitted from the floor F is insulated at a micro G level.

As shown in FIG. 2, the linear motor 32A includes a stator 33A and a mover 34A. The stator 33A is fixed on the +X side of the upper surface of the reticle base 31 with the Y-axis direction coinciding with the longitudinal direction, and is sectionally U-shaped. The mover 34A is engaged with the stator 33A, and projects toward the +X side of the reticle stage RST. Further, the linear motor 32B includes a stator 33B and mover 34B. The stator 33B is fixed on the -X side of the upper surface of the reticle base 31 with the Y-axis direction coinciding with the longitudinal direction, and is sectionally U-shaped. The mover 34B is engaged with the stator 33B, and projects toward the -X side of the reticle stage RST. As these linear motors 32A and 32B, linear motors based on the known moving coil type Lorentz force driving method are used in this embodiment. However, as the linear motors 32A and 32B, linear motors of the moving magnetic type can be used.

Air pads (not shown) of the movers 34A and 34B are arranged on the surface opposing the reticle base 31, in order to support the weight of the movers 34A and 34B and the reticle stage RST. The reticle stage RST is supported by air levitation above the reticle base 31 via these air pads in a non-contact state. Y guides (not shown) to guide the movements of the movers 34A and 34B (i.e., the movement of the reticle stage RST) in the Y-axis direction and to restrict their movements in the X-axis direction are arranged on the reticle base 31. Air pads (not shown) are arranged on the opposing surface of the Y guides of the movers 34A and 34B.

The reticle stage RST comprises a reticle coarse adjustment stage RC, which is driven by the linear motors 32A and 32B in the Y-axis direction, and has a planar view of a rectangular frame. The reticle stage RST also comprises a reticle fine adjustment stage RF, which is almost a square shape, and is arranged in the internal space of the reticle coarse adjustment stage RC via a pair of X-axis fine adjustment motors 35X1 and 35X2 and a pair of Y-axis fine adjustment motors 35Y1 and 35Y2, respectively formed by a voice coil motor. The reticle R is held on the reticle fine adjustment stage RF via vacuum chucking or electrostatic chucking (not shown). The fine adjustment stage device is structured of the X-axis fine adjustment motors 35X1 and 35X2 and Y-axis fine adjustment motors 35Y1 and 35Y2.

Referring back to FIG. 1, a movable mirror 36 to reflect a laser beam from a reticle laser interferometer 37 (to be referred to as a reticle interferometer) serving as a position detection device is fixed on the reticle stage RST. The position of the reticle stage RST within the stage movement plane is always detected by the reticle laser interferometer 37 with, for example, a resolution of around 0.5 to 1 nm. This reticle interferometer 37 is fixed on the base support plate 23. A reference mirror (fixed mirror) for the reticle interferometer 37, omitted in drawings, is fixed on the lens barrel portion of the projection optical system PL (to be described later). The positional information (or velocity information) of the reticle stage RST from the reticle interferometer 37 is sent to a stage control system 91 and to a main controller 90 through the stage control system 91. Then, the stage control system 91, following the instructions from the main controller 90, drives the reticle stage RST (i.e., the reticle coarse adjustment stage RC and reticle fine adjustment stage RF) via the linear motors 32A and 32B and voice coil motors 35X1, 35X2, 35Y1, and 35Y2 based on the positional information of the reticle stage RST.

In practice, as shown in FIG. 2, on the reticle stage RST, a movable mirror 36Y3, movable mirrors 36Y1 and 36Y2, and movable mirror 36X are arranged. The movable mirror 36Y3 is mounted on the reticle coarse adjustment stage RC to detect its position in the Y-axis direction, which is the scanning direction of the reticle coarse adjustment stage RC. The movable mirrors 36Y1 and 36Y2 are mounted on the reticle fine adjustment stage RF to detect its position in the Y-axis direction and its rotation around the Z-axis. The movable mirror 36X is mounted on the reticle fine adjustment stage RF to detect its position in the X-axis direction, which is the non-scanning direction of the reticle fine adjustment stage RF. These mirrors are, however, representatively shown as the movable mirror 36 in FIG. 1. In addition, four reticle interferometers (not shown) are used with respect to the above four movable mirrors, and they are representatively shown as the reticle interferometer 37 in FIG. 1.

The projection optical system PL is fixed on a column 25 serving as a holding member (to be described later) below the reticle stage RST in FIG. 1, and its optical axis AX0 (coinciding with the optical axis of the illumination system 10) is referred to as the Z-axis direction. In this embodiment, the projection optical system PL is a reduction system that is double telecentric, and is a refractive optical system structured of a plurality of lens elements arranged at predetermined intervals along the optical axis AX. The projection optical system PL has a predetermined projection magnification, e.g., ¼, ⅕, or ⅙. So, when an illumination area of the reticle R is illuminated with illumination light from the illumination system 10, a reduced image (partial inverted image) of a circuit pattern in an illumination area of the reticle R is formed through the projection optical system PL in an exposure area. This exposure area is on the wafer W (W1 or W2) which surface is coated with a photoresist, and is conjugate to the illumination area.

The column 25 is structured of four pillars 27 standing upright via a plurality of (four in this case) vibration isolating units 26A, 26B, 26C, and 26D (the vibration isolating units 26C and 26D are to be on the back side of the drawing of FIG. 1, although not shown), and of a lens barrel surface plate 28 horizontally supported by the four pillars 27. In this case, the vibration isolating units 26A to 26D have the same arrangement as the vibration isolating units 21A to 21D described above and insulate fine vibration transmitted from the floor F at a micro G level.

In the central portion of the lens barrel surface plate 28, an opening that is circular in a planar view is formed, and the projection optical system PL is inserted into the opening from above. Of the projection optical system PL in the direction of height, a flange portion FLG is arranged at a position slightly below the central portion of the lens barrel portion. The projection optical system PL is fixed to the lens barrel surface plate 28 via the flange portion FLG.

Figure 3:
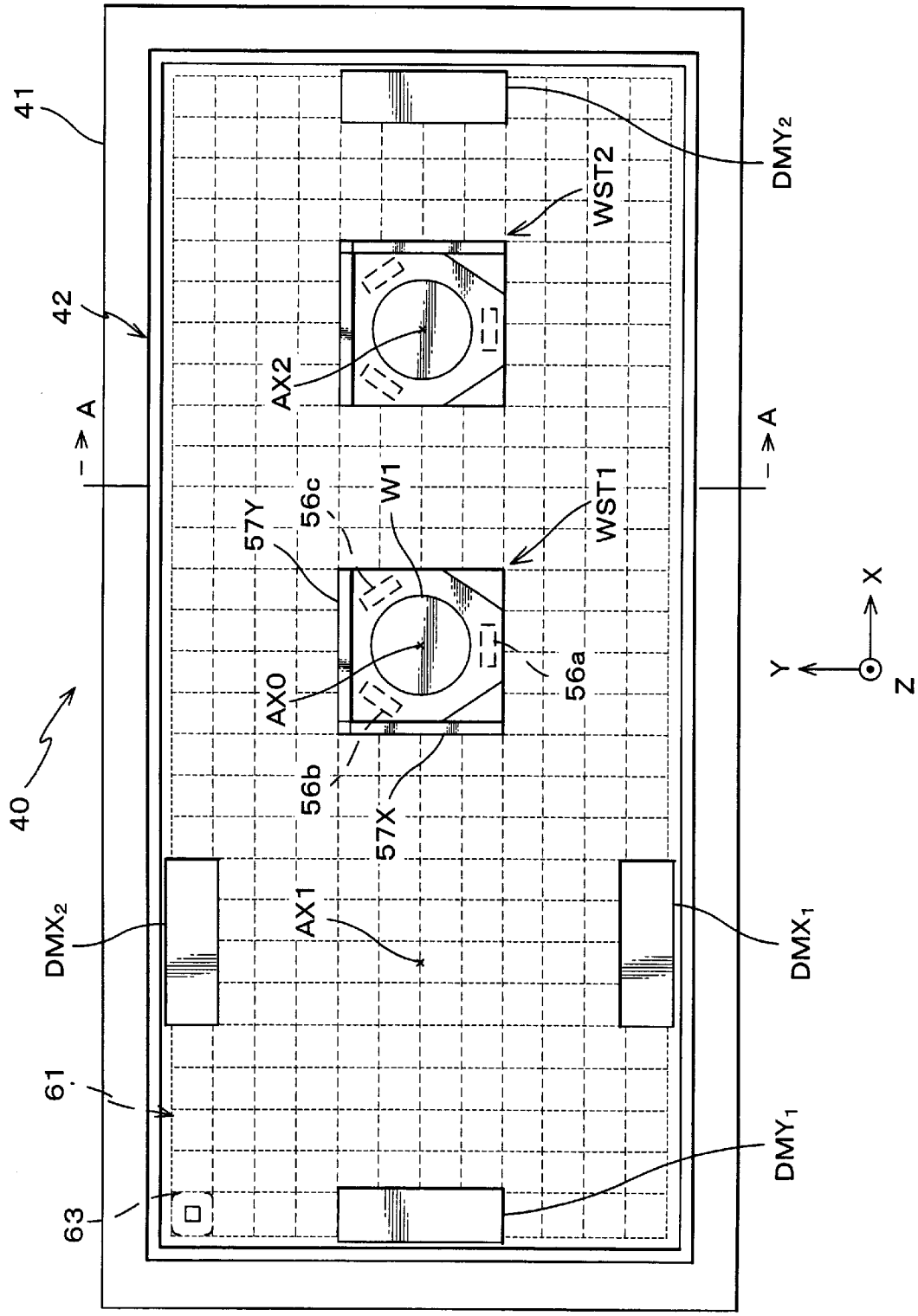
FIG. 3 is a planar view to explain the arrangement of a wafer stage device in FIG. 1.

As comprehensively shown in FIGS. 1 and 3, the alignment detection systems ALG1 and ALG2 are fixed to the lens barrel surface plate 28 on both sides of the projection optical system PL in the X-axis direction. In this case, the alignment detection system ALG1 has an optical axis AX1 parallel to the Z-axis direction, and the alignment detection system ALG2 has an optical axis AX2 also parallel to the Z-axis direction. As these alignment detection systems ALG1 and ALG2, image forming alignment sensors based on an image processing method, i.e., FIA (Field Image Alignment) sensors are used.

As the alignment detection systems ALG1 and ALG2, LSA (Laser Step Alignment) sensors or LIA (Laser Interferometric Alignment) sensors can be used instead of FIA sensors. Alternatively, a combination of an FIA sensor, LSA sensor, and LIA sensor can also be used.

In this embodiment, the alignment detection systems ALG1 and ALG2 are used to perform a so-called search alignment, in which a rough position measurement is performed on a wafer by detecting the positions of three one-dimensional marks on the wafer. A fine alignment is also performed, in which the position of each shot area on the wafer is accurately measured.

In this case, one alignment detection system ALG1 is used to detect alignment marks on the wafer W1 and reference marks (not shown) on the wafer stage WST1. The other alignment detection system ALG2 is used to detect alignment marks on the wafer W2 and reference marks (not shown) on the wafer stage WST2. The detection results obtained by these alignment detection systems ALG1 and ALG2 are sent to the main controller 90.

The wafer stage device 40 comprises a wafer base support plate 41 serving as a base support member fixed on the floor F, a wafer base 42 as a base supported by air levitation on the wafer base support plate 41 via an air bearing (not shown), a stator 60 incorporated in the wafer base 42, the wafer stages WST1 and WST2 supported by air levitation on the wafer base 42 via air bearings (not shown), moving blocks $DMX_1$, $DMX_2$, $DMY_1$, and $DMY_2$ (the moving block $DMX_2$ on the back side of the drawing of FIG. 1 is not shown; see FIG. 3) as mass bodies, movers $50W_1$ and $50W_2$ as a first and second mover fixed on the wafer stages WST1 and WST2, and movers $50DX_1$, $50DX_2$, $50DY_1$, and $50DY_2$ fixed on the moving blocks $DMX_1$, $DMX_2$, $DMY_1$, and $DMY_2$. The moving blocks $DMX_1$, $DMX_2$, $DMY_1$, and $DMY_2$ configure a moving member. The stator 60 and mover $50W_1$ configure a first driving unit (a planar motor in this case), and the stator 60 and mover $50W_2$ configure a second driving unit (a planar motor in this case). The movers $50DX_1$, $50DX_2$, $50DY_1$, and $50DY_2$ configure a third mover, and the stator 60 and movers $50DX_1$, $50DX_2$, $50DY_1$, and $50DY_2$ configure a third driving unit (four linear motors in this case). In addition, the stator 60, the moving blocks $DMX_1$, $DMX_2$, $DMY_1$, and $DMY_2$, and the wafer base 42 configure a substrate stage reaction force processing device and a suppressing device to keep the center of gravity of the substrate stage from moving.

On the bottom surface of the wafer base 42, air pads (e.g., vacuum pressurized type air bearings) (not shown in Figs.) are arranged at a plurality of positions. And by the balance between the air exhausting force of the air pads and the vacuum pressurized force, the wafer base 42 is supported by air levitation above the wafer base support plate 41 by, around several microns, so that it can move two-dimensionally in the X and Y directions. Also, on the upper surface of the wafer base 42, X guides (not shown) are arranged to guide the movements of the movers $50DX_1$ and $50DX_2$ in the X-axis direction and to restrict their movements in the Y-axis direction, whereas Y guides (not shown) are arranged to guide the movements of the movers $50DY_1$ and $50DY_2$ in the Y-axis direction and to restrict their movements in the X-axis direction.

On the wafer stage WST1, the wafer W1 is fixed by, for example, vacuum chucking or electrostatic chucking. Also, on the wafer stage WST1, a movable mirror 57 to reflect a laser beam from a wafer laser interferometer (to be referred to as a "wafer interferometer" hereinafter) $58_1$ serving as a first position detector is fixed. And the position of the wafer stage WST1 within the X-Y plane is always detected with, for example, a resolution of around 0.5 to 1 nm by the wafer interferometer $58_1$ fixed on the column 25. In practice, as shown in FIG. 3, a movable mirror 57Y having a reflecting surface perpendicular to the Y-axis direction which is the scanning direction, and a movable mirror 57X having a reflecting surface perpendicular to the X-axis direction which is the non-scanning direction are arranged on the wafer stage WST1. In the scanning direction, one wafer laser interferometer is arranged, and in the non-scanning direction, two wafer laser interferometers are arranged as the wafer laser interferometer $58_1$. These components are representatively shown as the movable mirror 57 and wafer interferometer $58_1$ in FIG. 1. The positional information (or velocity information) of the wafer stage WST1 is sent to the stage control system 91 and to the main controller 90 through the stage control system 91. The stage control system 91 controls the movement of the wafer stage WST1 within the X-Y plane through a planar motor device structured of the rotator 60 and mover $50W_1$ based on the positional information (or velocity information) in accordance with the instruction from the main controller 90.

On the wafer stage WST2, the wafer W2 is fixed by, for example, vacuum chucking or electrostatic chucking. Also, on the wafer stage WST2, a movable mirror 57 to reflect a laser beam from a wafer laser interferometer (to be referred to as a "wafer interferometer" hereinafter) $58_2$ serving as a second position detector is fixed. And the position of the wafer stage WST2 within the X-Y plane is always detected with, for example, a resolution of around 0.5 to 1 nm by the wafer interferometer $58_2$ fixed on the column 25. In this case, as in the case of the wafer stage WST1 described above, as shown in FIG. 3, a movable mirror 57Y having a reflecting surface perpendicular to the Y-axis direction which is the scanning direction, and a movable mirror 57X having a reflecting surface perpendicular to the X-axis direction which is the non-scanning direction are arranged on the wafer stage WST2. In the scanning direction, one wafer laser interferometer is arranged, and in the non-scanning direction, two wafer laser interferometers are arranged as the wafer laser interferometer $58_2$. These components are representatively shown as the movable mirror 57 and wafer interferometer $58_2$ in FIG. 1. The positional information (or velocity information) of the wafer stage WST1 is sent to the stage control system 91 and to the main controller 90 through the stage control system 91. The stage control system 91 controls the movement of the wafer stage WST2 within the X-Y plane through a planar motor device structured of the rotator 60 and mover $50W_2$ based on the positional information (or velocity information) in accordance with the instruction from the main controller 90.

Movable mirrors (not shown in Figs.) perpendicular to the X-axis are arranged on the moving blocks $DMX_1$ and $DMX_2$, and one laser interferometer (not shown in FIGS.) is arranged in the X-axis direction corresponding the respective moving block. The position of the moving blocks $DMX_1$ and $DMX_2$ in the X-axis direction are detected at all times by this arrangement. Also, in the Y-axis direction, movable mirrors (not shown in Figs.) perpendicular to the Y-axis are arranged on the moving blocks $DMY_1$ and $DMY_2$, and one laser interferometer (not shown in FIGS.) is arranged corresponding to the respective moving block. With this arrangement, the position of the moving blocks $DMY_1$ and $DMY_2$ in the Y-axis direction are detected at all times. The positional information (or velocity information) of the moving blocks $DMX_1$, $DMX_2$, $DMY_1$, and $DMY_2$ is sent to the stage control system 91 and to the main controller 90 through the stage control system 91. And according to the instructions from the main controller 90 based on the positional information (or velocity information), the stage control system 91 controls the movements of the moving blocks $DMX_1$ and $DMX_2$ in the X-axis direction via two linear motors structured of the stator 60 and movers $50DX_1$ and $50DX_2$. The stage control system 91 also controls the moving blocks $DMY_1$ and $DMY_2$ in the Y-axis direction via two linear motors structured of the stator 60 and movers $50DY_1$ and $50DY_2$.

Furthermore, the apparatus shown in FIG. 1 has a multiple focal position detection system, which is one of the focus detection systems based on the oblique incident light method. This system is designed detect the position in the Z direction (optical axis AX direction) of a portion in the exposure area and its neighboring areas on the wafer (wafer W1 in FIG. 1), which is positioned below the projection optical system PL. The multiple focal position detection system is structured of a light-emitting optical system and a light-receiving optical system (not shown in Figs.). The detailed arrangement and the like of this multiple focal position detection system are disclosed in, for example, U.S. Pat. No. 5,448,332, and the disclosures cited above are fully incorporated by reference herein.

Figure 4:
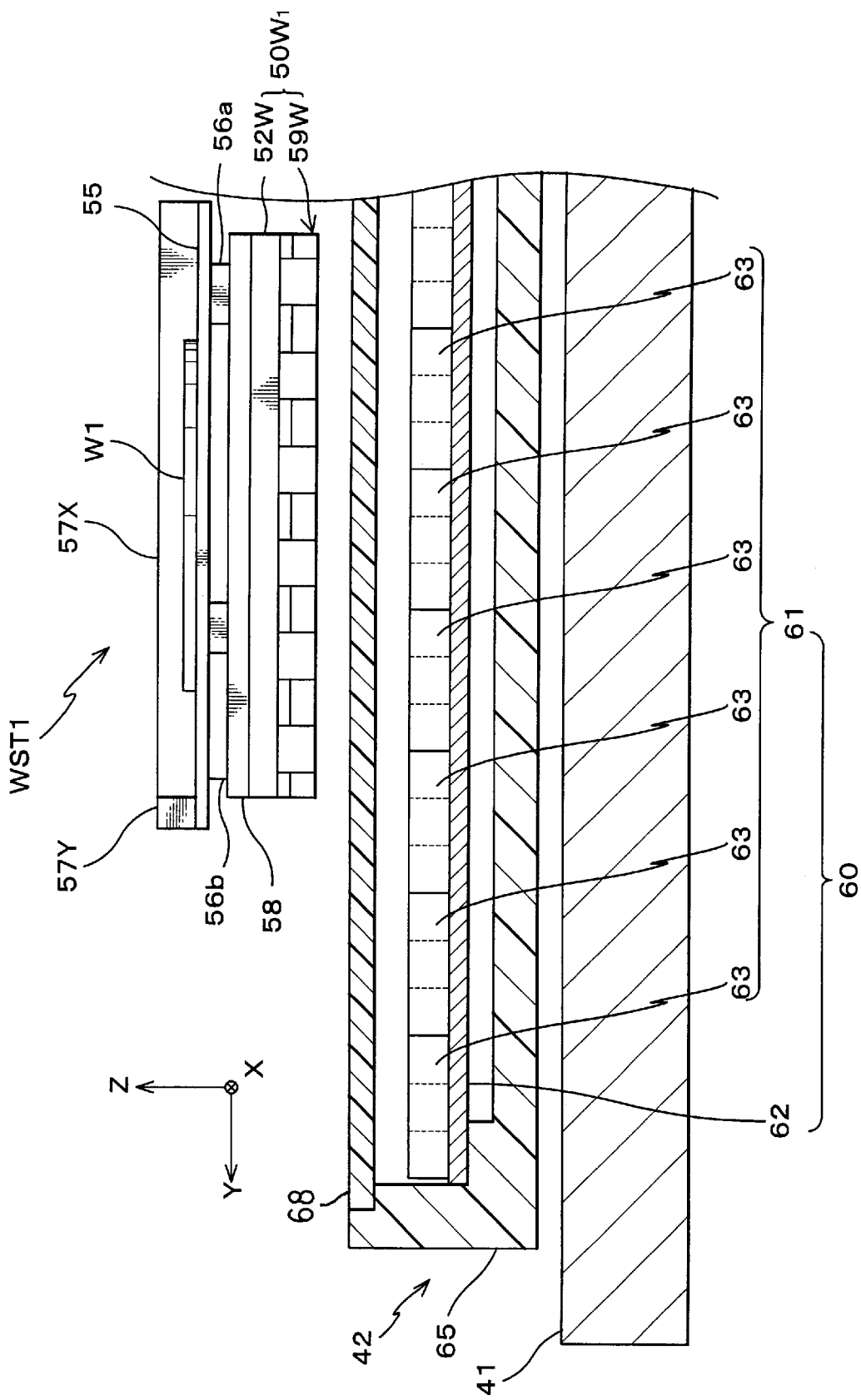
FIG. 4 is a sectional view to explain the arrangement of the wafer stage device in FIG. 1.

Next, the arrangement of each component of the wafer stage device 40 will be described in detail, with reference to FIGS. 3 to 9. FIG. 3 is a planar view of the stage device 30. FIG. 4 is a sectional view taken along a line A—A in FIG. 3.

As comprehensively shown in FIG. 3, which is a planar view of the wafer stage device, and FIG. 4, which is a sectional view taken along the line A—A (a cross-sectional view of X-Z) in FIG. 3, the wafer stage WST1 includes a substrate table 55 on which the wafer W1 is mounted, support mechanisms 56a, 56b, and 56c which include voice coil motors, are arranged on the upper surface (the surface located on the opposite side of the surface facing the base) of the mover 51 and support the substrate table 55 at three different points and the like, and a plate-shaped member 58 on which the support mechanisms 56a, 56b, and 56c are arranged. And on the bottom surface of the plate shaped member 58, the mover $50W_1$ is fixed. On the wafer stage WST1, the support mechanisms 56a to 56c allow the substrate table 55 to be tilted with respect to the X-Y plane and driven in the Z-axis direction. Although the support mechanisms 56a to 56c are omitted in FIG. 1, they are actually driven and controlled independently by the stage control system 91 in FIG. 1 via a driving mechanism (not shown in Figs.).

As comprehensively shown in FIGS. 3 and 4, the wafer base 42 includes a frame member 65 which has a rectangular shape in a planar view, a flat shaped magnetic member 62 made of a magnetic material and arranged at the central portion of the frame member 65 in the direction of height, and a flat plate shaped member 68 made of a substantially nonmagnetic material such as ceramics and is integrally attached to the frame member 65 to close its upper opening.

Figure 5:
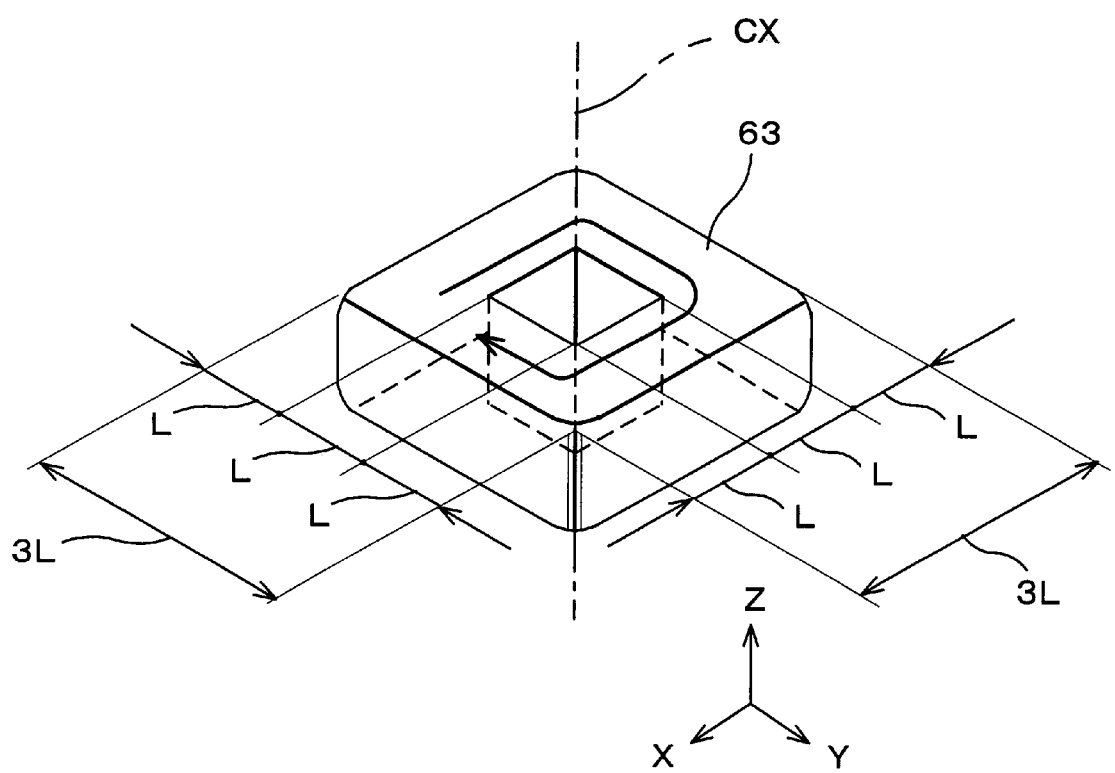
FIG. 5 is a view showing the arrangement of an armature coil.

On the upper surface of the magnetic member 62, a plurality of armature coils 63 is arranged in the form of a matrix. FIG. 3 shows only one armature coil 63 on the upper left portion in a specific shape, and other armature coils 63 are shown in squares for the sake of simplicity. As shown in FIG. 4, an armature unit 61 is structured of these armature coils 63. The stator 60, referred to earlier, is structured of the armature unit 61 and the magnetic member 62. The armature coils 63 of the armature unit 61, as shown in FIG. 5, each have a bottom surface of a square shape (parallel to the X-Y plane) with one side having the length of 3L. Each armature coil is structured like a prism, and around the area of the central axis CX, which is parallel to the Z-axis direction, a hole penetrates the area in the Z axis direction creating a hollow portion. This hollow portion has a cross-sectional shape of a square, with one side having the length of L. Electric current is supplied from a current driving unit (not shown in Figs.) to the armature coils 63. The current supplied to the armature coils 63 flows around the central axis CX with an almost uniform current density (volume density). The current values and direction of current flowing in the armature coils 63 are controlled by the stage control system 91 through the current driving unit (not shown in Figs.).

In this embodiment, the armature coils 63 are cooled to prevent a rise in the temperature of the armature coils 63 and their peripheral members and to suppress the atmosphere of the armature coils 63 from fluctuating, by the heat generated by the armature coil when current is supplied. Such cooling is performed by making the closed space surrounded with the flat plate shaped member 68, the frame member 65, and the magnetic member 62 serve as a path for a coolant (refrigerant) to cool the armature coils 63 of the armature unit 61. More specifically, an inlet opening (not shown in Figs.) is formed at one side of the closed space, and an outlet opening (discharging port) is formed at the other side the closed space. When a coolant (e.g., water or fluorine inert fluid) is supplied from a cooling controller (not shown) into the closed space through the inlet opening and flows through the closed space, the coolant exchanges heat with the armature coils 63 and absorbs the heat generated by the armature coils 63. The heated coolant is then discharged outside through the outlet opening.

As shown in FIG. 4, the mover $50W_1$ includes a magnet supporting member 52W made of a nonmagnetic material, a magnetic pole unit 59W formed of permanent magnets arranged in X and Y two-dimensional directions on the bottom surface of the magnet supporting member 52W by a predetermined arrangement, and a plurality of air pads (air bearings) serving as aerostatic bearings (not shown in Figs.) arranged between specific adjacent permanent magnets on the bottom surface of the magnet supporting member 52W.

Figure 6:
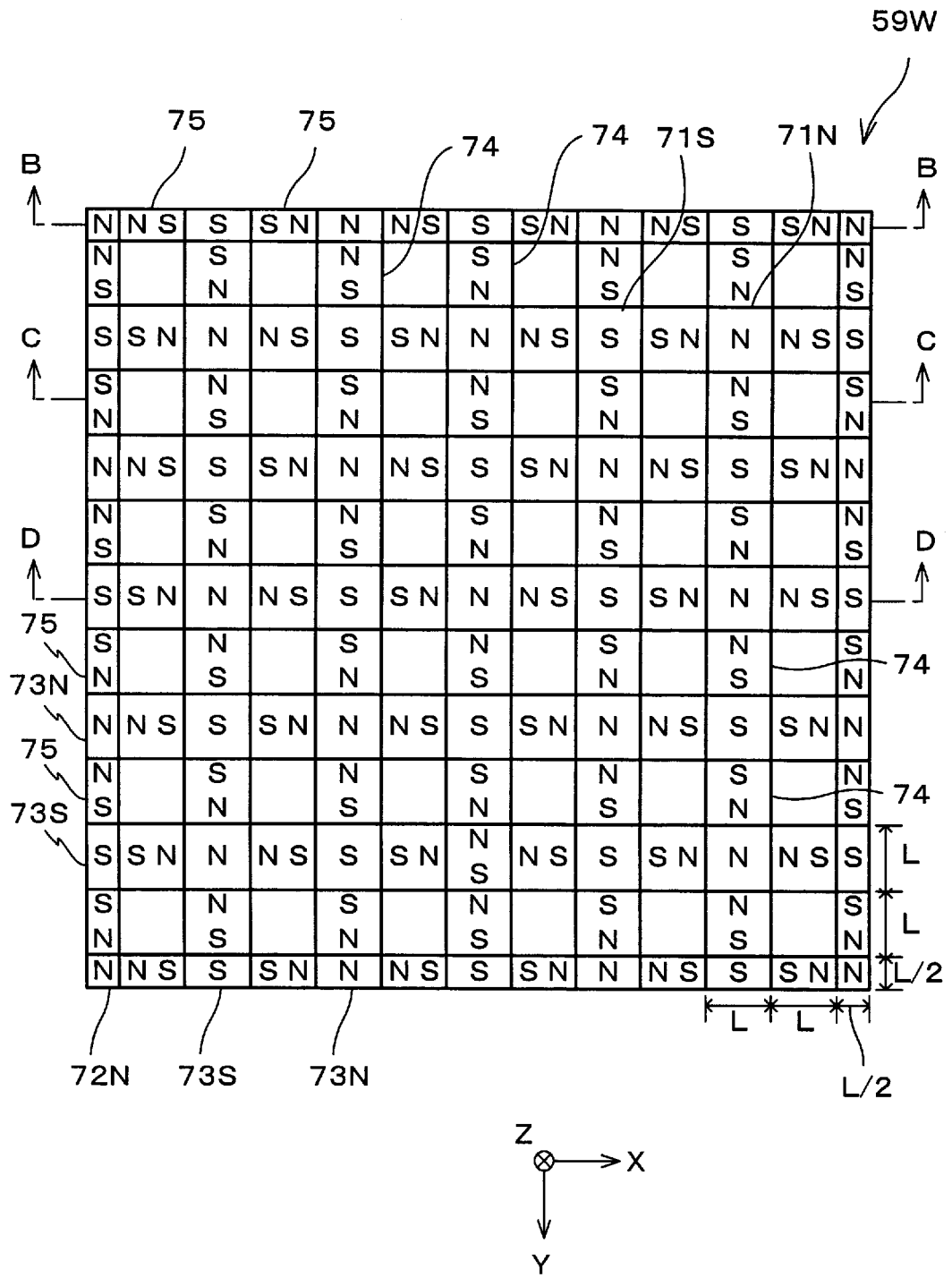
FIG. 6 is a bottom view to explain the arrangement of the magnets of a mover for the wafer stage.

More specifically, the magnet supporting member 52W has a substantially square shape in a planar view, and on its bottom surface has the magnetic pole unit 59W like the one shown in FIGS. 6 and 7A to 7C. The magnetic pole unit 59W is structured of permanent magnets 71N, 71S, 72N, 73N, 73S, 74, and 75, which are arranged in a reticulated grating in a planar view. The size of each magnet and the arrangement of the respective pole surfaces are shown in FIGS. 6 and 7A to 7C. FIG. 6 is a bottom view of the magnetic pole unit 59W. FIG. 7A is a sectional view taken along a line B—B in FIG. 6. FIG. 7B is a sectional view taken along a line C—C in FIG. 6. FIG. 7C is a sectional view taken along a line D—D in FIG. 6.

As shown in FIGS. 7A to 7C, the above permanent magnets 71N, 71S, 72N, 73N, 73S, 74, and 75 are combined so that their bottom surfaces, i.e., the surfaces opposite to the wafer base 42, are flush. Consequently, the magnetic pole surfaces of the permanent magnets 71N, 71S, 72N, 73N, and 73S of the magnetic pole unit 59W (located on the opposite side of the surface facing the wafer base 42) are a height T lower than the surfaces of the permanent magnets 74 and 75. The surfaces of the permanent magnets 74 and 75 are also located on the opposite side of the surface facing the wafer base 42; thus recess portions are formed. And, as shown in FIGS. 7A and 7C, magnetic members 77 are inserted into the recess portions of the upper portion of the permanent magnets 71N and 71S, and magnetic members 78 are inserted in the recess portions of the upper portions of the permanent magnets 72N. In addition, magnetic members 79 are inserted in the recess portions of the upper portions of the permanent magnets 73N and 73S. The dimensions of these magnetic members 77 to 79 are shown in FIGS. 7A to 7C, and are made of a material, e.g., free cutting pure iron, which has a high permeability and high saturation flux density and is easy to form holes for screws.

As shown in FIG. 6, with the magnetic pole unit 59W, a plurality of spaces surrounded by the permanent magnet 74 or permanent magnets 74 and 75 are formed. Air pads (not shown in Figs.) are inserted into a plurality of spaces selected from the spaces. The air pads can be screwed to the magnet supporting member 52W or integrally formed by cutting the bottom surface member of the magnet supporting member 52W. Alternatively, the air pads can be attached to the bottom surface of the magnet supporting member 52W with an adhesive (epoxy-based adhesive).

The wafer stage WST2 has the same arrangement as that of the wafer stage WST1 described above. In addition, the mover 50W$_2$, that has the wafer stage WST2 fixed on its upper surface, has the same arrangement as that of the mover 50W$_1$ described above.

Figure 8:
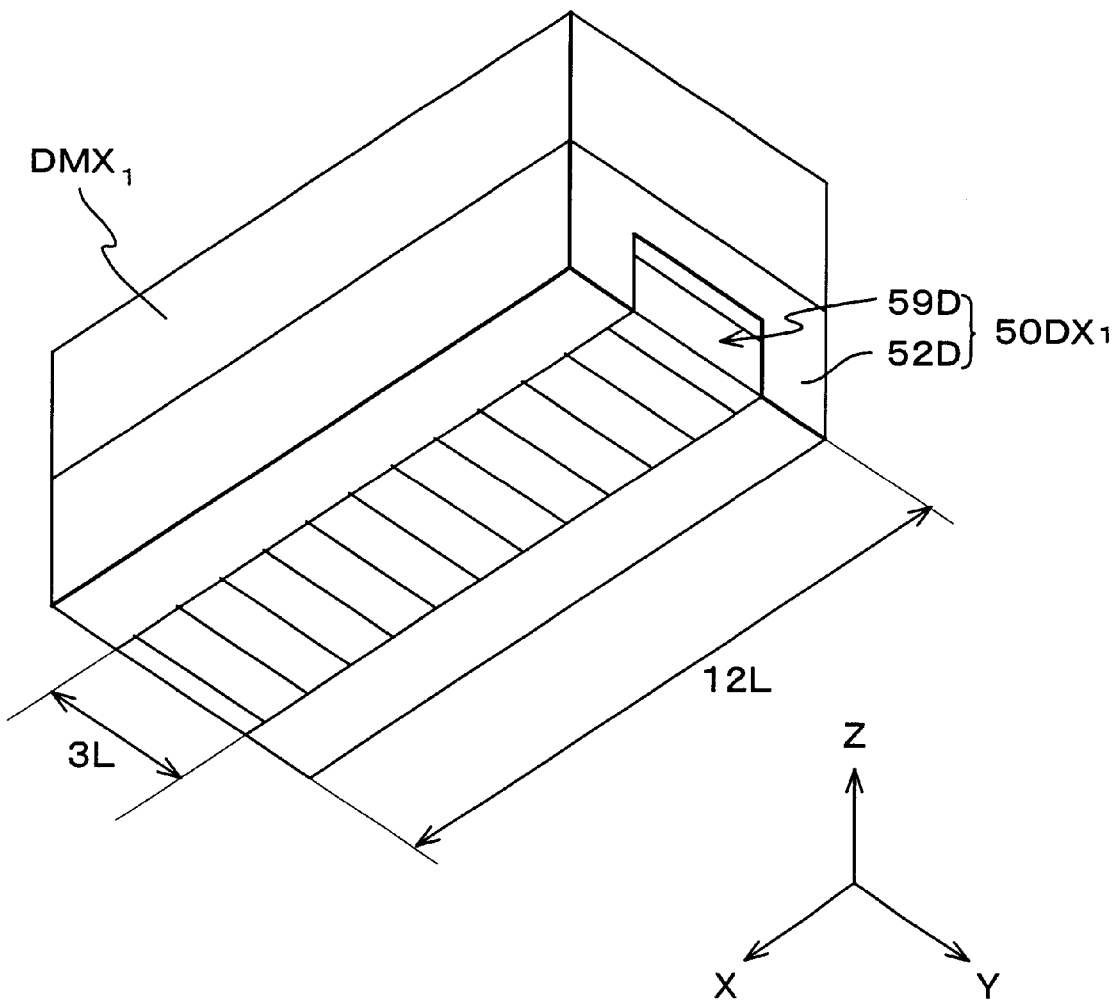
FIG. 8 is a perspective view to explain the arrangement of the magnets of a mover for a moving member.

As shown in FIG. 8, the moving block DMX$_1$ is a rectangular parallelepiped member with the length in the X-axis direction being 12L. As the material for the moving block DMX$_1$, from the viewpoint of preferably forming a magnetic circuit (to be described later) a material being nonmagnetic, and also from the viewpoint of downsizing, a material that has a high density is selected. The mover 50DX$_1$ is fixed to the bottom surface of the moving block DMX$_1$.

The mover 50DX$_1$ includes a magnetic pole unit 59D having a length 12L in the X-axis direction and a length 3L in the Y-axis direction, a magnet supporting member 52D having a recess portion in its bottom surface portion to house the magnetic pole unit 59D. It also includes air pads (air bearings) (to be referred to as "Z air pads" hereinafter) formed on the bottom surface of the magnet supporting member 52D serving as a plurality of aerostatic bearings (not shown), and air pads (air bearings) (to be referred to as "Y air pads" hereinafter) formed on the side surfaces of the magnet supporting member 52D serving as a plurality of aerostatic bearings (not shown in Figs.). The moving block DMX$_1$ is fixed on the upper surface of the magnet supporting member 52D. The mover 50DX$_1$ is supported by levitation above the flat plate shaped member 68 in a noncontact state by air (gas) exhausted from the Z air pads to the flat plate shaped member 68. In addition, air is exhausted from the Y air pads to Y guides (not shown) which are arranged on the flat plate shaped member 68 to guide the movement of the mover 50DX$_1$ in the X-axis direction and restrict its movement in the Y-axis direction.

As shown in FIGS. 9A and 9B, the magnetic pole unit 59D is structured of permanent magnets 81N, 81S, 83N, and 84 arrayed along the Z-axis direction. The dimensions of the respective magnets and the arrangement of the pole surfaces are shown in FIGS. 9A and 9B. FIG. 9A is a bottom view of the magnetic pole unit 59D. FIG. 9B is a sectional view taken along the X-Z plane of the magnetic pole unit 59D.

As shown in FIG. 9B, the permanent magnets 81N, 81S, 83N, and 84 are combined with each other such that their bottom surfaces, i.e., the surfaces opposite to the wafer base 42, are flush, thus forming a magnetic pole unit.

The pole surfaces of the permanent magnets 81N, 81S, and 83N, located on the opposite side of the side facing the wafer base 42, are lower than the surfaces of the permanent magnets 84, also located on the opposite side of the side facing the wafer base 42. They are lower by a height T, thus forming recess portions. And in the recess portions of the upper portions of the permanent magnets 81N and 81S, as shown in FIG. 9B, magnetic members 87 are inserted and fixed with an adhesive or the like. Also, in the recess portions of the upper portions of the permanent magnets 83N, magnetic members 89 are inserted and fixed with an adhesive or the like. The dimensions of the permanent magnets 87 and 89 are shown in FIGS. 9A and 9B, and are made of a material, e.g., free cutting pure iron, which has a high permeability and high saturation flux density and is easy to form holes for screws, similar to the above magnetic members 77 to 79.

The moving block DMX$_2$ has the same arrangement as that of the moving block DMX$_1$ described above. The mover 50DX$_2$ that has the moving block DMX$_2$ fixed to its upper surface has the same arrangement as that of the 50DX$_1$. Each of the moving blocks DMY$_1$ and DMY$_2$ have the same arrangement as that of the moving block DMX$_1$, except for the X-axis direction of the moving block DMX$_1$ being the Y-axis direction with the moving blocks DMY$_1$ and DMY$_2$. Each of the movers 50DY$_1$ and 50DY$_2$ respectively having the moving blocks DMY$_1$ and DMY$_2$ fixed on their upper surfaces have the same arrangement as that of the mover 50DX$_1$ except for the X-axis direction of the mover 50DX$_1$ being the Y-axis direction with the movers 50DY$_1$ and 50DY$_2$.

As shown in FIG. 3, the composite unit structured of the moving block DMX$_1$ and mover 50DX$_1$ is placed on the +Z side of the −Y side edge portion of the armature unit 61. The composite unit structured of the moving block DMX$_2$ and mover 50DX$_2$ is placed on the +Z side of the +Y side edge portion of the armature unit 61. The composite unit structured of the moving block $DMY_1$ and mover $50DY_1$ is placed on the +Z side of the −X side edge portion of the armature unit 61. The composite unit structured of the moving block $DMY_2$ and mover $50DY_2$ is placed on the +Z side of the +X side edge portion of the armature unit 61.

The principle based on which the wafers W1 and W2, i.e., the movers $50W_1$ and $50W_2$, are driven in this embodiment will be described next.

With the magnetic pole unit 59W of the mover $50W_1$, a representative case is shown, indicated by the solid arrows in FIG. 10, related to the permanent magnets 71N, 71S, and 74. In this case, the permanent magnets 71N, 72N, and 73N, in which the pole surfaces opposing the magnetic member 62 (i.e., pole surfaces opposite to the wafer base 42) are N poles, generate a magnetic flux in the −Z direction (downward from the drawing surface). The permanent magnets 71S and 73S, on the other hand, which magnetic faces oppose the magnetic member 62, are S poles, and generate a magnetic flux in the +Z direction (upward from the drawing surface). These permanent magnets structure a magnetic circuit, along with the permanent magnets 74 and 75 and the magnetic members 77, 78, 79, and the magnetic member 62. The magnetic circuits are formed in every adjacent perpendicularly magnetized magnet in the arrays of the perpendicularly magnetized magnets 71N, 71S, 72N, 73N, and 73S. In the arrangement of such a magnetic circuit, the magnetic member 62 is used in all the magnetic circuits. And in the magnetic circuit related with the permanent magnets 71N and 71S, the permanent magnet 74 and magnetic member 77 are further used. In the magnetic circuit related with the permanent magnets 73N and 73S, the permanent magnet 75 and magnetic member 79 are further used. In the magnetic circuit related with the permanent magnets 71N and 73S or permanent magnets 71S and 73N, the permanent magnet 74 and magnetic members 77 and 79 are further used. In the magnetic circuit related with the permanent magnets 72N and 73S, the permanent magnet 75 and magnetic members 78 and 79 are further used.

The magnetic circuit related to the permanent magnet 71N and the permanent magnet 71S located in the +X direction, with respect to the permanent magnet 71N will be described as an example below with reference to FIGS. 10A and 10B.

Figure 10A:
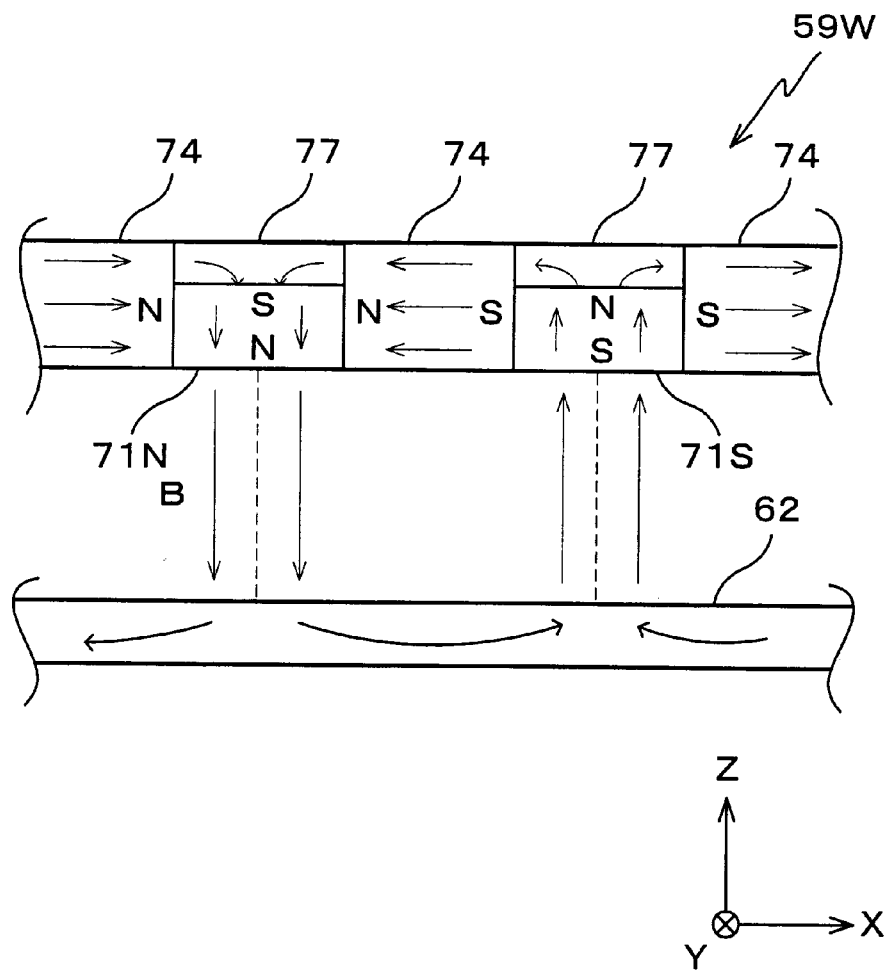
FIGS. 10A and 10B are views to explain a magnetic circuit formed by the magnetic pole unit of the mover for the wafer stage.

In this magnetic circuit, as shown in FIG. 10A, the magnetic flux emitted from the N pole surface of the permanent magnet 71N flow toward the magnetic member 62 in the −Z direction. Once it reaches the magnetic member 62, the magnetic flux flows through the magnetic member 62 in the +X direction and reaches the position opposing the S pole surface of the permanent magnet 71S. Thereafter, the magnetic flux flows toward the S pole surface of the permanent magnet 71S in the +Z direction.

The magnetic flux that reaches the S pole surface of the permanent magnet 71S then flows within the permanent magnet. Some magnetic flux directly reaches the S pole surface of the permanent magnet 74. The remaining magnetic flux reaches the S pole surface of the permanent magnet 74 from the N pole surface of the permanent magnet 71S via the magnetic member 77, which is adhesively fixed to the N pole surface. Thereafter, the magnetic flux flows through the permanent magnet 74 in the −x direction, and comes to the N pole surface of the permanent magnet 74.

Some the magnetic flux that reaches the N pole surface of the permanent magnet 74 directly flow into the permanent magnet 71N. The remaining magnetic flux flow into the magnetic member 77, which is adhesively fixed to the S pole surface of the permanent magnet 71N and then reaches the S pole surface of the permanent magnet 71N. Thereafter, the magnetic flux flows through the permanent magnet 71N toward the N pole surface of the permanent magnet 71N.

Thus, a magnetic circuit is formed, in which the magnetic flux sequentially circulate through the permanent magnet 71N, magnetic member 62, permanent magnet 71S, and permanent magnet 74 (and magnetic member 77). Although the magnet supporting member 52W is fixed on the upper surface of the magnetic pole unit 59W, since the magnet supporting member 52W is made of a nonmagnetic material, the magnetic flux hardly leaks into the magnet supporting member 52W. The thickness T of the respective magnetic members 77 to 79 is set in consideration of the permeability and saturation flux density of the magnetic members 77 to 79. Therefore, the thickness is of a minimum value, in which the leakage flux above the magnetic pole unit 59W falls within a permissible value.

In this magnetic circuit, on the opposing side of the magnetic pole unit 59W to the wafer base 42, the magnetic members 77 which have a magnetic reluctance much lower than that of air or the like are arranged. They serve as a flowing path for the magnetic flux from the N pole surface of the permanent magnet 74 to the S pole surface of the permanent magnet 71N, and a flowing path for the magnetic flux from the N pole surface of the permanent magnet 71S to the S pole surface of the permanent magnet 74. This reduces the amount of the magnetic flux leaking above the magnetic pole unit 59W. In addition, since the magnetic member 62 is arranged to oppose the N pole surface of the permanent magnet 71N and the S pole surface of the permanent magnet 71S, the amount of magnetic flux leaking below the magnetic member 62 is reduced. For this reason, almost all the magnetic flux generated by the magnetomotive forces of the permanent magnets 71N, 71S, and 74 flow in the above magnetic circuit. Therefore, a magnetic flux with a high magnetic flux density can be generated between the magnetic pole unit 59W and the magnetic member 62, without magnetically affecting the peripheral members and devices above the magnetic pole unit 59W.

The magnetic circuit related to the permanent magnet 71N and the permanent magnet 71S located in the +X direction, with respect to the permanent magnet 71N has been described above. Similarly, magnetic circuits are formed, with the magnetic circuit related to the permanent magnet 71N and the permanent magnet 71S located in the −X direction, with respect to the permanent magnet 71N. And, the same can be said with the magnetic circuit related to the permanent magnet 71N and the permanent magnet 71S located in the +Y direction with respect to the permanent magnet 71N. In addition, a magnetic circuit is similarly formed, related to the permanent magnet 71N (71S) and permanent magnet 73S (73N), as well as a magnetic circuit related to the permanent magnet 72N and permanent magnet 73S.

Figure 10B:
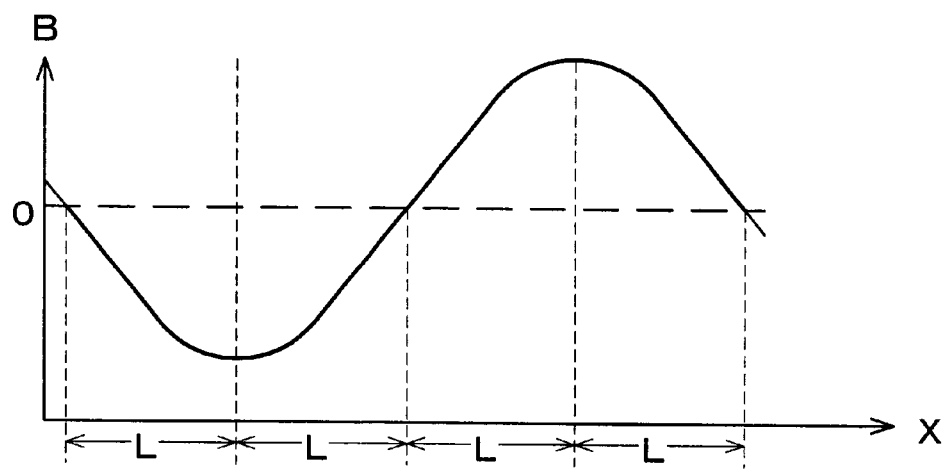

When the magnetic circuit shown in FIG. 10A is formed, the magnetic flux density B around the magnetic member 62, i.e., at a Z position where the armature unit 61 is arranged, exhibits a distribution as the one shown in FIG. 10B. That is, the absolute value of the magnetic flux density B becomes a maximum at a position corresponding to the central point of the permanent magnet 71N (71S), and the value decreases as the position moves to the peripheral portion of the pole surface. And the magnetic flux density B becomes zero at the midpoint between a position corresponding to the center of the permanent magnet 71N (71S), and a position corresponding to the center of an adjacent permanent magnet 71S (71N) in the arrangement of perpendicularly magnetized magnets. Also, the distribution of the magnetic flux density B is symmetrical in the ±X direction, with the position corresponding to the center of the permanent magnet 71N (71S) as a center. In other words, the distribution shape of the magnetic flux density B in the X-direction is almost approximate to a sinusoid or a trapezoid. Referring to FIG. 10B, when the magnetic flux flows in the +Z direction, the magnetic flux density B takes a positive value. When the magnetic flux flows in the −Z direction, the magnetic flux density B takes a negative value. Although FIG. 10B shows the distribution of the magnetic flux density B in the X direction, the magnetic flux density B in the Y direction is similar to the one shown in FIG. 10B.

In this embodiment, as the material for the magnetic member 62, stainless steel or the like with a high electric resistance, high saturation flux density, low magnetic hysteresis, and low coercive force is used. This can reduce an eddy current and hysteresis loss, and a low magnetoresistance can be maintained. Therefore, magnetic flux with a high magnetic flux density can be continuously generated, even if the magnetic pole unit 59W is moved.

Following is the description of the mover 51, which is driven by the Lorentz force generated by the interaction of the magnetic flux between the magnetic pole unit 59W and the magnetic member 62, and the current flowing in the armature coil 63.

Prior to driving the mover $50W_1$ by the Lorentz force, the main controller 90 actuates an air pump (not shown in Figs.) to exhaust air with a predetermined pressure from air pads for the wafer stage, against the upper surface of the wafer base 42. As a consequence, the moving member, i.e., the overall wafer stage WST and mover $50W_1$, are supported by air levitation, via for example, a clearance of around 5 $\mu$m above the wafer base 42 (see FIGS. 1 and 4).

During air levitation, a magnetic suction force acts between the magnetic pole unit 59W of the mover $50W_1$ and the magnetic member 62 in the wafer base 42. Accordingly, equivalent to the sum of this magnetic suction force and the weight of the moving member itself as a downward force, an upward force (levitation force) is generated.

In an environment of the magnetic flux density B having the distribution shown in FIG. 10B, when a current is supplied to the armature coil 63, the Lorentz force is generated in the armature coil 63. The reaction force of this Lorentz force acts on the magnetic pole unit 59W to move the wafer stage WST1, as well as the wafer W. The magnitude and direction of the Lorentz force generated by the armature coil 63 vary, depending on the amount and direction of the current supplied to the armature coil 63 and the positional relationship between the magnetic pole unit 59W and the armature unit 61. In this embodiment, when the wafer stage WST1 is to be moved in the X direction, a pair of armature coils 63 adjacent to each other in the X direction are selected corresponding with the X position of the magnetic pole unit 59W. Sine currents having a phase difference of 90° and the same amplitude are supplied to the respective armature coils 63 in accordance with the positional relationship between the magnetic pole unit 59W and the armature unit 61. The X component of the resultant of forces of the Lorentz force is thus stably controlled, regardless of the X position of the magnetic pole unit 59W. In general, when electrical current is supplied to drive the magnetic pole unit 59W in the X direction, a force which drives the magnetic pole unit 59W in the Y direction and a rotational force around the Z-axis are generated. For this reason, the current supplied to each armature coil 63 is adjusted so that the force that drives the magnetic pole unit 59W in the Y direction and the rotational force become zero as a total. In addition, by controlling the amount and direction of a sine current supplied to each armature coil, the amount and direction of a force that drives the magnetic pole unit 59W are controlled.

Also, when the wafer stage WST1 is to be moved in the Y direction, the magnetic pole unit 59W is driven in the Y direction with a predetermined driving force regardless of the Y position of the magnetic pole unit 59W, similar to the X direction.

And, the current pattern used to drive the magnetic pole unit 59W in the X direction and the current pattern used to drive the magnetic pole unit 59W in the Y direction are overlaid at an appropriate ratio to make a pattern, and supplied to each armature coil 63. This drives the magnetic pole unit 59W in an arbitrary direction, along the X-Y plane by an arbitrary driving force.

Furthermore, by driving the magnetic pole unit 59W without canceling out the rotational force, the magnetic pole unit 59W is rotationally driven in a desired rotational direction with a desired rotational force.

As described above, with the exposure apparatus in this embodiment, by controlling the current supplied to each armature coil 63 in accordance with X-Y position and posture (rotation around the Z-axis) θ of the wafer stage WST1, the position of the wafer stage WST1, as well as the wafer W, is controlled.

The wafer W2, i.e., the mover $50W_2$, is driven in the same manner as the wafer W1 and mover $50W_1$.

The principle of driving the moving blocks $DMX_1$, $DMX_2$, $DMY_1$, and $DMY_2$, i.e., the movers $50DX_1$, $50DX_2$, $50DY_1$, and $50DY_2$, in this embodiment, will be briefly described next.

With the magnetic pole unit 59D of the mover $50DX_1$, a magnetic circuit like the one shown in FIG. 10A is formed in the X-axis direction. The same magnetic flux density B similar to that shown in FIG. 10B is generated. That is, the distribution shape of the magnetic flux density B in the X-direction is almost approximate to a sinusoid or a trapezoid. With regard to the magnetic flux distribution in the Y direction, in an area facing the magnetic pole unit 59D, the magnetic flux density B does not change even with a change in Y position. And in the area that does not face the magnetic pole unit 59D, the magnetic flux density B is 0.

Following is the description of the mover $51DX_1$, which is driven by the Lorentz force generated by the interaction of the magnetic flux between the magnetic pole unit 59D and the magnetic member 62, and the current flowing in the armature coil 63.

Prior to driving the mover $50BX_1$ by the Lorentz force, the main controller 90 actuates an air pump (not shown in Figs.) to exhaust air with a predetermined pressure from air pads for the wafer stage, against the upper surface of the wafer base 42. As a consequence, the moving member, i.e., the overall wafer stage WST and mover $50W_1$, are supported by air levitation, via for example, a clearance of around 5 $\mu$m above the wafer base 42 (see FIGS. 1 and 4). In addition, air with a predetermined pressure is exhausted from the above Y air pads against the above Y guides.

When a current is supplied to the armature coil 63 under the environment of the above magnetic flux density distribution, the Lorentz force is generated in the armature coil 63. The reaction force of this Lorentz force acts on the magnetic pole unit 59D to move the mover 50DX$_1$, as well as the moving block DMX$_1$. The width of the area in the Y-axis direction where the magnetic flux density distribution is generated coincides with the width of the armature coil 63 in the Y direction. Therefore, one or two armature coils 63 are arranged in the Y-axis direction to face the magnetic pole unit 59D. When one armature coil 63 is arranged in the Y-axis direction to face the magnetic pole unit 59D, and electric current is supplied to the armature coil 63 to generate a driving force, the total sum of the Lorentz force generated in the armature coil 63 becomes 0. On the other hand, in the case two armature coils 63 are arranged in the Y-axis direction to face the magnetic pole unit 59D, the driving force is generated by supplying an equal amount of electric current to the two adjacent armature coils 63 in the Y-axis direction. This makes the total sum of Lorentz force generated in the armature coils 63 become 0. By controlling the current as described above, the resultant of forces of the Lorentz force generated by the armature coil 63 which faces the magnetic pole unit 59D can be made to act in only the X-axis direction. This allows a structure of a linear motor to drive the mover 50DX$_1$ in the X-axis direction by the stator 60 and mover 50DX$_1$. In this embodiment, as shown in FIG. 3, by arranging one armature coil 63 in the Y-axis direction to face the magnetic pole unit 59W of the mover 50DX$_1$, a linear motor which drives the mover 50DX$_1$ in the X-axis direction by the stator 60 and mover 50DX$_1$ is formed.

The amount and direction of a Lorentz force generated in the armature coil 63 vary, depending on the amount and direction of the current supplied to the armature coil 63 and the positional relationship between the magnetic pole unit 59D and the armature unit 61. In this embodiment, when the moving block DMX$_1$ is to be moved in the X-axis direction, a pair of adjacent armature coils 63 in the X direction are selected in accordance with the X position of the magnetic pole unit 59D. Then, sine currents having a phase difference of 90° and the same amplitude are supplied to the respective armature coils 63 in accordance with the positional relationship between the magnetic pole unit 59D and the armature unit 61. This stably controls the X component of the resultant of forces of the Lorentz force, regardless of the X position of the magnetic pole unit 59D.

As described above, with the exposure apparatus in this embodiment, by controlling the current supplied to the armature coil 63 in accordance with the X position of the moving block DMX$_1$, the moving block DMX$_1$ is driven and controlled.

The mover 50DX$_2$ is driven similarly as the mover 50DX$_1$ described above. In addition, the movers 50DY$_1$ and 50DY$_2$ are driven likewise as the above mover 50DX$_1$ except for the X-axis direction in driving the mover 50DX$_1$ being the Y-axis direction in the case of the movers 50DY$_1$ and 50DY$_2$.

The principle of canceling a reaction force which acts on the stator 60 when driving the wafer stages WST1 and WST2, and the principle of canceling the movement of the center of gravity of the wafer stage device 40 when moving the wafer stages WST1 and WST2, will be briefly described next with reference to FIG. 11. The X-Y position of the center of gravity of the stator is to coincide with the point G$_0$ in FIG. 11. In the following description, a force F is to be expressed in X and Y components like the force F(F$_X$, F$_Y$), and a point G is to be expressed in X and Y components such as the point G(G$_X$, G$_Y$) with the point G$_0$ regarded as the origin of the X-Y position coordinate system.

The cancellation of a reaction force, which acts on the stator 60 when driving the wafer stages WST1 and WST2, will be described first.

Figure 11:
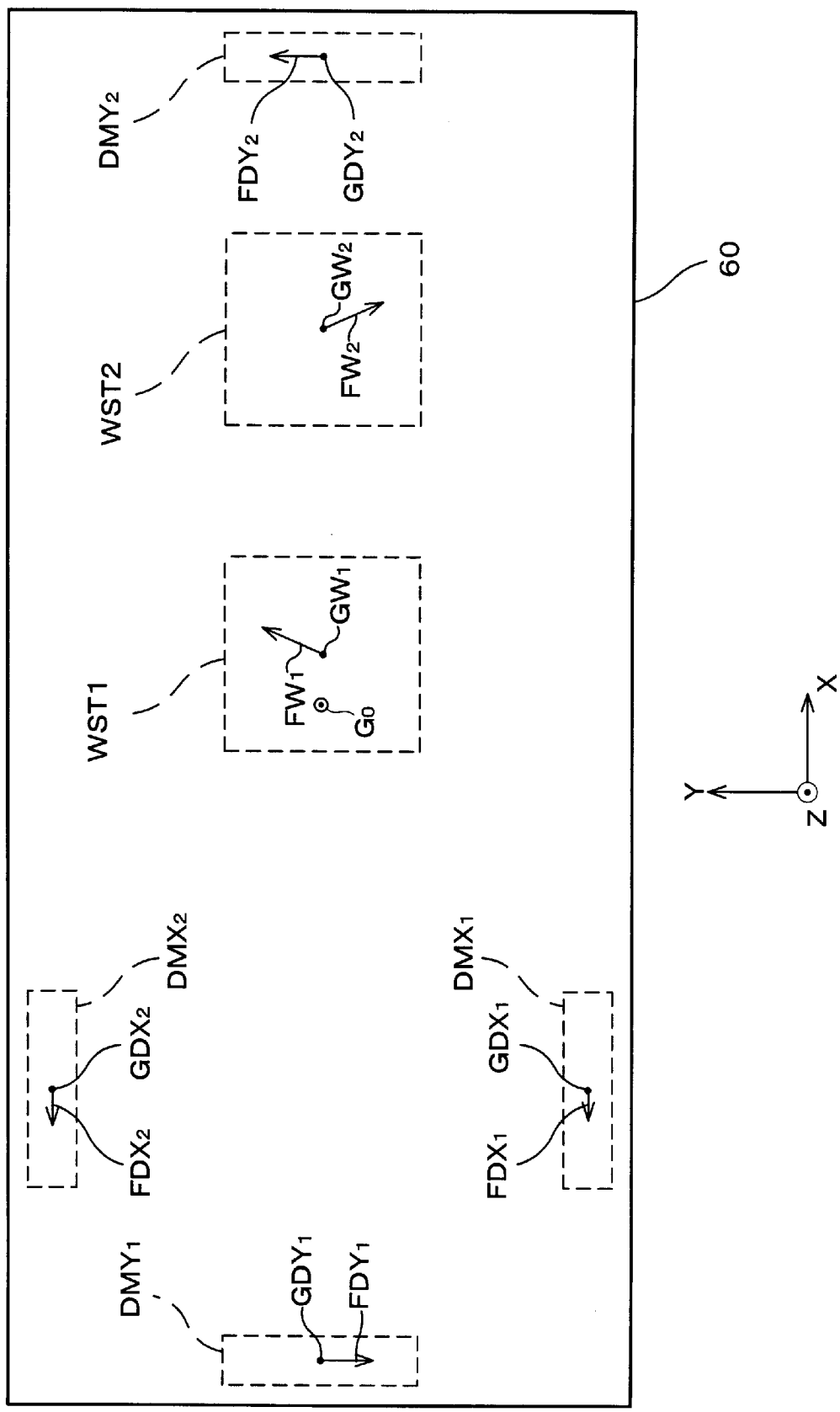
FIG. 11 is a view to explain the cancellation of the reaction force acting on a stator.

As shown in FIG. 11, in general, when the wafer stage WST1 at an X-Y position GW$_1$(GW$_{1X}$, GW$_{1Y}$) is driven, a reaction force FW$_1$(FW$_{1X}$, FW$_{1Y}$) acts on the stator 60, and when the wafer stage WST2 at an X-Y position GW$_2$(GW$_{2X}$, GW$_{2Y}$) is driven, a reaction force FW$_2$(FW$_{2X}$, FW$_{2Y}$) acts on the stator 60. The wafer stages WST1 and WST2, on which such reaction forces act, are driven under the control of the main controller 90, therefore, the position GW$_1$(GW$_{1X}$, GW$_{1Y}$), force FW$_1$ (FW$_{1X}$, FW$_{1Y}$), position GW$_2$(GW$_{2X}$, GW$_{2Y}$), and force FW$_2$(FW$_{2X}$, FW$_{2Y}$) are known by the main controller 90.

When the wafer stages WST1 and WST2 are driven, the moving blocks DMX$_1$, DMX$_2$, DMY$_1$, and DMY$_2$ are respectively located at the position of GDX$_1$(GDX$_{1X}$, GDX$_{1Y}$), GDX$_2$(GDX$_{2X}$, GDX$_{2Y}$), GDY$_1$(GDY$_{1X}$, GDY$_{1Y}$), and GDY$_2$ (GDY$_{2X}$, GDY$_{2Y}$) In this case, the moving blocks DMX$_1$ and DMX$_2$ move in only the X-axis direction, therefore the Y-coordinate values GDX$_{1Y}$ and GDX$_{2Y}$ are known as predetermined values to the main controller 90. In addition, since the moving blocks DMY$_1$ and DMY$_2$ move in only the Y-axis direction, the X-coordinate values GDY$_{1X}$ and GDY$_{2X}$ are known as predetermined values to the main controller 90.

By controlling and driving the moving blocks DMX$_1$, DMX$_2$, DMY$_1$, and DMY$_2$, the main controller 90 can actuate the desired forces FDX$_1$(FDX$_{1X}$, 0), FDX$_2$(FDX$_{2X}$, 0), FDY$_1$(0, FDY$_{1X}$), and FDY$_2$(0, FDY$_{2X}$). The main controller 90, therefore, generates the forces FDX$_1$(FDX$_{1X}$, 0), FDX$_2$(FDX$_{2X}$, 0), FDY$_1$(0, FDY$_{1X}$), and FDY$_2$(0, FDY$_{2X}$) which satisfy the following simultaneous equations, in the stator 60 by controlling and driving the moving blocks DMX$_1$, DMX$_2$, DMY$_1$, and DMY$_2$, in order to cancel the reaction forces FW$_1$ (FW$_{1X}$, FW$_{1Y}$) and FW$_2$(FW$_{2X}$, FW$_{2Y}$) acting on the stator 60 upon driving the wafer stages WST1 and WST2:

$$FW_{1X}+FW_{2X}+FDX_{1X}+FDX_{2X}=0 \quad (3)$$

$$FW_{1Y}+FW_{2Y}+FDY_{1Y}+FDY_{2Y}=0 \quad (4)$$

$$\begin{vmatrix} GW_{1X} & GW_{1Y} \\ FW_{1X} & FW_{1Y} \end{vmatrix} + \begin{vmatrix} GW_{2X} & GW_{2Y} \\ FW_{2X} & FW_{2Y} \end{vmatrix} \quad (5)$$

$$\begin{vmatrix} GDX_{1X} & GDX_{1Y} \\ FDX_{1X} & 0 \end{vmatrix} + \begin{vmatrix} GDX_{2X} & GDX_{2Y} \\ FDX_{2X} & 0 \end{vmatrix}$$

$$\begin{vmatrix} GDY_{1X} & GDY_{1Y} \\ 0 & FDY_{1Y} \end{vmatrix} + \begin{vmatrix} GDY_{2X} & GDY_{2Y} \\ 0 & FDX_{2Y} \end{vmatrix} = 0$$

Since above equations are three simultaneous equations including four unknowns [FDX$_{1X}$, FDX$_{2X}$, FDY$_{1Y}$, FDY$_{2Y}$], solutions invariably exist. Accordingly, from the combinations of forces FDX$_{1X}$, FDX$_{2X}$, FDY$_{1Y}$ and FDY$_{2Y}$, which satisfy the equation (3) to (5), one combination can be selected. And by supplying the current to the armature coils 63 to generate the selected combination, reaction forces acting on the stator 60 when driving the wafer stages WST1 and WST2, can be canceled. With the exposure apparatus 100 of this embodiment, from among the combination of forces FDX$_{1X}$, FDX$_{2X}$, FDY$_{1Y}$, FDY$_{2Y}$ satisfying the equations (3) to (5), a combination in which the total sum of the current supplied to the armature coils 63 is small, is selected.

As described above, with the apparatus of this embodiment, the main controller 90 drives and controls the moving blocks DMX$_1$, DMX$_2$, DMY$_1$, and DMY$_2$, making the forces FDX$_1$, FDX$_2$, FDY$_1$, and FDY$_2$ satisfying the equations (3) to (5) act on the stator 60 via the stage control system 91. This cancels the reaction force acting on the stator 60 upon driving of the wafer stages WST1 and WST2. Accordingly, the force to accurately cancel the reaction force acting on the stator 60 upon driving of the wafer stages WST1 and WST2, act on the stator 60 without any time lag when the reaction force is generated. This makes it possible to accurately cancel the reaction force.

In the case, the reaction force is not completely canceled out by the reaction canceling operation performed by controlling and driving the moving blocks $DMX_1$, $DMX_2$, $DMY_1$, and $DMY_2$ the residual reaction force act on the entire wafer base 42 through the stator 60. However, since the wafer base 42 is supported by air levitation above the wafer base support plate 41 and can move within the X-Y plane, the above residual force is to be used as a driving force for the wafer base 42.

Also, as described above, when the moving blocks $DMX_1$, $DMX_2$, $DMY_1$, and $DMY_2$ are controlled and driven to cancel the reaction force acting on the stator 60 upon driving of the wafer stages WST1 and WST2, driving forces are canceled out when viewed from the overall system structured of the wafer stages WST1 and WST2 and the moving blocks $DMX_1$, $DMX_2$, $DMY_1$, and $DMY_2$. The center of gravity of the wafer stage device 40 moving when the wafer stages WST1 and WST2 move, is thus canceled with the movement of the moving blocks $DMX_1$, $DMX_2$, $DMY_1$, and $DMY_2$. In the case the reaction force cannot be totally canceled by the reaction canceling operation performed by controlling and driving the moving blocks $DMX_1$, $DMX_2$, $DMY_1$, and $DMY_2$, and the center of gravity moving cannot be entirely canceled by moving the moving blocks $DMX_1$, $DMX_2$, $DMY_1$, and $DMY_2$, the shift in the center of gravity of the wafer stage device 40 is canceled out by moving the wafer base 42.

Therefore, according to this embodiment, arbitrarily driving the wafer stages WST1 and WST2 and the reaction force and center of gravity moving caused by this driving, do not cause deformation and vibration of devices and members externally arranged of the wafer stage device 40. Accordingly, with the exposure apparatus of this embodiment, the pattern formed on the reticle R can be transferred onto the wafers W1 and W2 with high precision.

By moving the reticle base 31, the reaction force generated when driving the reticle stage RST is absorbed, and the center of gravity of the reticle stage device 30 moving is also canceled out. For this reason, according to this embodiment, arbitrarily driving the reticle stage RST and the reaction force and center of gravity moving caused by this driving, do not cause deformation and vibration of devices and members externally arranged of the reticle stage device 30. Accordingly, with the exposure apparatus of this embodiment, the pattern formed on the reticle R can be transferred onto the wafers W1 and W2 with high precision.

An example of the exposure operation flow with the exposure apparatus 100 of this embodiment structured as above, will be briefly described.

First of all, the reticle R on which the pattern to be transferred is formed is loaded on the reticle stage RST by the reticle loader (not shown in Figs.). Likewise, the wafer W1 to be exposed is loaded on the wafer stage WST1 by the wafer loader (not shown in Figs.).

The wafer stage WST1 is supported by air levitation above the wafer base 41 at the first loading position, and is also servo-controlled by the main controller 90 through the stage control system 91 so as to stay at the first loading position for a predetermined period of time. The wafer stage WST2 is supported by air levitation above the wafer base 41 at the second loading position, and is also servo-controlled by the main controller 90 through the stage control system 91 so as to stay at the second loading position for a predetermined period of time. In addition, the moving blocks $DMX_1$, $DMX_2$, $DMY_1$, and $DMY_2$ are servo-controlled by the main controller 90 through the stage control system 91, to be respectively positioned at predetermined initial positions for a predetermined period of time. Accordingly, in this standby period, electric current is being supplied to the respective armature coils 63 structuring the stator 60. And, the main controller 90 is cooling the armature coils 63 with a cooling unit (not shown), so as to prevent the temperature from rising due to the heat generated in the armature coils 63.

Next, the main controller 90 controls the wafer stage WST1 so that it moves below the alignment detection system ALG1. Preparatory operations such as reticle alignment and baseline measurement are performed with predetermined procedures by using reference mark plates (not shown) on the wafer stage WST1 and the like. And after these operations, by using the alignment detection system ALG1, alignment measurements such as search alignment and EGA (Enhanced Global Alignment) based on a statistical technique are performed. The details of EGA measurement are disclosed in, for example, U.S. Pat. Nos. 4,780,617 and 4,962,318. The above-cited disclosures are fully incorporated by reference herein.

When moving the wafer stage WST1 in the alignment process related the wafer W1, the moving blocks $DMX_1$, $DMX_2$ $DMY_1$, and $DMY_2$ are controlled and driven as described above to cancel the reaction force acting when the wafer stage WST1 moves. This also cancels out the center of gravity moving, and the wafer base 42 is then finally moved, so that the residual force is completely canceled out.

After the alignment measurement of the wafer W1, the main controller 90 controls the wafer stage WST1 so that it is positioned below the projection optical system PL, and the wafer W1 is exposed based on the step-and-scan method as follows.

On exposing the wafer W1, first of all, the wafer stage WST1 is moved so that the X-Y position of the wafer W1 is set to a starting position for scanning exposure of the first shot area (first shot). This movement is performed by the main controller 90 controlling the current supplied to the armature coils 63 structuring the stator 60 through the stage control system 91, as described above. Simultaneously, the reticle stage RST is moved so that the X-Y position of the reticle R is set to a starting position for scanning exposure. The main controller 90 performs this movement, through the stage control system 91 and the like.

Then, the stage control system 91 synchronously moves the reticle R and wafer W in accordance with the X-Y positional information of the reticle R measured by the reticle interferometer 37, and the X-Y positional information of the wafer W1 measured by the wafer interferometer $58_1$. During this synchronous movement, the reticle R is illuminated in a rectangular (slit-shaped) illumination area which has a longitudinal direction in a direction perpendicular to the scanning direction of the reticle R, and the reticle R is scanned at a velocity $V_R$ on exposure. The illumination area (the center almost coinciding with the optical axis AX) is projected on the wafer W1 through the projection optical system PL, thereby forming a slit-shaped projection area, i.e., an exposure area, conjugate to the illumination area. Since the wafer W1 has an inverted image relationship with the reticle R, the wafer W is synchronously scanned at a velocity $V_W$ with the reticle R, in the direction opposite to the scanning direction of the reticle R scanned at the velocity $V_R$. The entire surface of the shot area on the wafer W can, therefore, be exposed. The scanning velocity ratio $V_W/V_R$ accurately corresponds to the reduction magnification of the projection optical system PL, thus, the pattern in a pattern area on the reticle R is accurately reduced and transferred onto the corresponding shot area on the wafer W1. The width of the illumination area in the longitudinal direction is larger than that of the pattern area on the reticle R and smaller than the maximum width of a light-shielding area. And, by scanning the reticle R, the entire surface of a pattern area PA is illuminated.

By scanning exposure controlled as described above, when the transfer of the reticle pattern onto one shot area is completed, the wafer stage WST1 is then stepped so as to perform scanning exposure on the next shot area. In this manner, stepping operation and scanning exposure are sequentially repeated so as to transfer the pattern onto the required number of shot areas on the wafer W1.

Concurrently with the exposure process for the wafer W1, the wafer W2 to be exposed is loaded onto the wafer stage WST2 by the wafer loader (not shown in Figs.). The main controller 90 controls the wafer stage WST2 so that it moves below the alignment detection system ALG2. As with the case of the wafer W1, preparatory operations such as reticle alignment and baseline measurement are performed by using reference mark plates (not shown) on the wafer stage WST2 and the like in accordance with predetermined procedures. And after the preparatory operations are completed, by using the alignment detection system ALG2, alignment measurement such as search alignment and EGA (Enhanced Global Alignment) based on a statistical technique are performed.

On moving the wafer stage WST1 in the exposure process for the wafer W1 and performing the load and alignment process for the wafer W2, the moving blocks $DMX_1$, $DMX_2$, $DMY_1$, and $DMY_2$ are controlled and driven as described above. This cancels the reaction force acting when the wafer stage WST1 is driven, and cancels the center of gravity moving, and the wafer base 42 is moved to finally cancel out the entire residual force. Cancellation of the reaction force generated upon movement of the reticle stage RST and cancellation of the center of gravity moving are similarly performed as above.

When exposure of the wafer W1 is completed, the wafer stage WST1 moves to the first loading position to unload the wafer W1 and load the next wafer (to be referred to as a "wafer W3" hereinafter). The main controller 90 controls the wafer stage WST1 so that it moves below the alignment detection system ALG1, and alignment measurement is performed as in the case of the wafer W1.

Concurrently with the wafer exchanging process for the wafer stage WST1 and the alignment process for the wafer W3, the main controller 90 controls the wafer stage WST2 so that it is positioned below the projection optical system PL. Thus, exposure based on the step-and-scan method is performed on the wafer W2, as is performed on wafer W1. In the wafer exchanging process and alignment process for the wafer stage WST1 and the exposure process for the wafer W2, likewise, cancellation of the reaction force acting when the wafer stages WST1 and WST2 move, and cancellation the center of gravity moving are performed. Cancellation of the reaction force when the reticle stage RST moves, and cancellation of the center of gravity moving are performed similarly, in the above manner.

When the exposure of the wafer W2 is completed, the wafer stage WST2 moves to the second loading position to unload the wafer W2 and load the next wafer (to be referred to as a "wafer W4" hereinafter). The main controller 90 controls the wafer stage WST2 so that it moves below the alignment detection system ALG2, and alignment measurement is performed as in the case of the wafer W2.

Concurrently with the wafer exchanging process for the wafer stage WST2 and the alignment process for the wafer W4, the main controller 90 controls the wafer stage WST1 so that it moves below the projection optical system PL after alignment measurement on the wafer W3. And as in the case of the wafer W1, exposure based on the step-and-scan method is performed on the wafer W3. On this wafer exchanging process for the wafer stage WST2, alignment process for the wafer W4, and exposure on the wafer W3 as well, the cancellation of the reaction force when driving the wafer stages WST1 and WST2, and cancellation of the center of gravity moving are performed, as described previously. Cancellation of the reaction force when driving the reticle stage RST and cancellation of the center of gravity moving are performed similarly as above.

Subsequently, on each wafer stage, the following three main operations are repeated sequentially: ①wafer exchange (wafer unloading+wafer loading)→②wafer alignment (search alignment+fine alignment)→③exposure based on step-and-scan method. The main controller 90, however, executes operations ① and ② on one wafer stage (WST1 or WST2) and concurrently executes operation ③ on the other wafer stage (WST2 or WST1). The operations are switched, when all the operations are completed, thus effectively preventing deformation and vibrations of the exposure apparatus, as disclosed in, for example, Japan Patent Laid Open No. 10-214783. According to the exposure apparatus 100 of this embodiment, therefore, the transfer precision of a pattern can be improved while greatly improving the throughput.

When one wafer stage (WST1 or WST2) moves in the +Y direction on scanning exposure, moving the other wafer stage (WST2 or WST1) in the −Y direction can reduce the reaction force generated upon movement of the wafer stage (WST1 or WST2) as well as reduce the center of gravity moving. In this case, the number of moving blocks $DX_1$, $DX_2$, $DY_1$, and $DY_2$ can be reduced, or omitted.

The exposure apparatus 100 of this embodiment can be made by assembling: the reticle stage device 30 structured of many mechanical parts; the projection optical system PL constituted by a plurality of lenses; the wafer stage device 40 constituted by many mechanical parts, and the like. And after incorporating the reticle stage device 30, projection optical system PL, wafer stage device 40, and the like, overall adjustment (electric adjustment, optical alignment, operation checks, and the like) is performed. The exposure apparatus 100 is preferably made in a clean room where conditions such as temperature, degree of cleanliness, and the like are controlled.

With the embodiment above, the air guide mechanism is used for the reticle stage device 30 and wafer stage device 40 to levitate the mover from the stator. However, magnetic levitation mechanism can also be used. In addition, for the magnetic pole units, instead of the permanent magnets, electromagnets equivalent to the permanent magnets may be possibly used.

Also, the shapes and arrangement of the magnets used for the magnet pole units of the wafer stage device 40, and the shapes and arrangement of the armature coils for the armature unit may be determined in accordance with the form of driving the electromagnetic force to be employed takes.

And, in the embodiment above, with the wafer stage device 40, the magnetic members are used as holding members for the armature coils; however, nonmagnetic members can also be used. When nonmagnetic members are used as holding members for the armature coils, magnetic flux having components in the horizontal direction (components in the X or Y direction) can be generated. Therefore, each magnetic pole unit can be driven along a horizontal plane (X-Y plane) as well as be driven along the Z direction.

Furthermore, in the embodiment above, a liquid coolant is used to cool the armature coils. However, a gas refrigerant can also be used, so long as it is a fluid serving as a coolant.

Also in the embodiment above, with the wafer stage device 40, each mover comprises a magnetic pole unit, and each stator comprises an armature unit. However, each mover may comprise an armature unit, and each stator may comprise a magnetic pole unit.

In the embodiment above, the moving blocks $DMX_1$, $DMX_2$, $DMY_1$, and $DMY_2$ are driven linearly, by driving the movers (magnetic pole unit) $50DX_1$, $50DX_2$, $50DY_1$, and $50DY_2$ supported by air levitation above the stator (armature unit) 60 which is used to drive the wafer stages WST1 and WST2. Alternatively, ordinary linear motors can be used to drive these moving blocks.

Furthermore, planar motors are used to drive the wafer stages WST1 and WST2. However, these stages can also be configured so that a combination of linear motors drives them two-dimensionally.

And in the embodiment above, the reticle stage device 30 has one reticle stage. Alternatively, this apparatus may have two reticle stages to perform double exposure with a high throughput by alternately moving the two reticle stages above the projection optical system PL. This makes it possible to obtain a high resolution and increase the DOF (Depth of Focus). The details of such a double exposure sequence and the like are disclosed in Japan Patent Laid Open No. 10-214783. The disclosed technique can be used with or without any partial modification in the embodiment described above. And, by arranging the moving blocks $DX_1$, $DX_2$, $DY_1$, and $DY_2$ on the reticle stage RST side, the cancellation processing for the reaction force and the cancellation of the center of gravity moving as described in the embodiment above, can also be applied to the reticle stage RST side.

Also, the reticle column is placed on the floor, independent of the main body column. However, it is possible to arrange the reticle column on the lens barrel surface plate of the main body column. Furthermore, the wafer base support plate is directly placed on the floor, however, it can be supported by suspension from the lens barrel surface plate.

And, in the embodiment above, as the projection optical system PL, a refraction optical system is used. However, the present invention is not limited to this, and as the projection optical system, a reflection system or reflection/refraction system may be used. Furthermore, the projection optical system is not limited to a reduction magnification system, and an equal magnification type or enlargement magnification type optical system may be used.

In addition, the present invention can be applied to any types of wafer exposure apparatus or exposure apparatus for liquid crystal displays, such as a reduction projection exposure apparatus using a light source to emit ultraviolet rays, a reduction projection exposure apparatus using a light source to emit soft X-rays having a wavelength of about 10 nm, an X-ray exposure apparatus using a light source to emit light having a wavelength of about 1 nm, and an exposure apparatus using EB (Electron Beams) or ion beams. And, the present invention can be applied to an apparatus employing a step-and-repeat method, step-and-scan method, and step-and-stitching method. However, in the case of applying the present invention to an apparatus in which a vacuum must be produced in an environment surrounding a wafer and the like, such as a reduction projection exposure apparatus using a light source to emit soft X-rays having a wavelength of about 10 nm, an X-ray exposure apparatus using a light source to emit light having a wavelength of about 1 nm, an exposure apparatus using EB (Electron Beams) or ion beams, or the like, a magnetic levitation mechanism or the like is preferably used.

In addition, the stage device of the present invention is not limited to a substrate stage device in an exposure apparatus. For example, the present invention can be applied to a reticle stage device in an exposure apparatus, or an apparatus other than an exposure apparatus if a sample requires positional control.

As have been described in detail, according to the stage device of the present invention, the center of the gravity of the stage device moving which is caused by moving the two stages, and the deformation of the apparatus which is also caused by driving the two stages, are reduced by moving or driving the moving member, and moving the base. Therefore, the influence caused by the center of gravity moving by the stages being driven, and vibration due to the reaction force can be reduced, while independently driving the two stages.

In addition, according to the exposure apparatus of the present invention, by using the stage device of the present invention a pattern is transferred onto two substrates while the positions of the two substrates are controlled. Thus, the transfer precision of the pattern can be improved, while allowing great improvement in the throughput.

While the above-described embodiments of the present invention are the presently preferred embodiments thereof, those skilled in the art of lithography systems will readily recognize that numerous additions, modifications and substitutions may be made to the above-described embodiments without departing from the spirit and scope thereof. It is intended that all such modifications, additions and substitutions fall within the scope of the present invention, which is best defined by the claims appended below.

What is claimed is:

1. A stage device comprising:
   a first and a second stage movably supported on a base;
   a moving member which is movably supported on said base and moves to cancel out a shift in a center of gravity of said stage device when at least one of said first and second stages moves;
   a first driving unit which includes a first mover fixed to said first stage and a first stator fixed to said base, said first driving unit driving said first mover by electromagnetic interaction;
   a second driving unit which includes a second mover fixed to said second stage and a second stator fixed to said base, said second driving unit driving said second mover by electromagnetic interaction; and
   a third driving unit which drives said moving member by electromagnetic interaction when at least one of said first and second stages moves.

2. A stage device according to claim 1, further comprising a base supporting member which movably supports said base.

3. A stage device according to claim 2, wherein said base moves on said base supporting member by a resultant of forces of
   a reaction force generated when at least one of said first and second stages moves, and a reaction force generated when said moving member moves.

4. A stage device according to claim 1, wherein said moving member comprises a plurality of mass bodies capable of moving independently.

5. A stage device according to claim 4, wherein said plurality of mass bodies are not less than three, and said plurality of mass bodies respectively moves one-dimensionally along an axis respectively corresponding to said plurality of mass bodies, said respective axis not all parallel.

6. A stage device according to claim 1, wherein said third driving unit includes a third mover fixed to said moving member and a third stator fixed to said base.

7. An exposure apparatus to transfer a predetermined pattern onto a substrate by exposing said substrate with an energy beam, said exposure apparatus comprising:

a stage device including, a first and a second stage movably supported on a base, a moving member which is movably supported on said base and moves to cancel out a shift in a center of gravity of said stage device when at least one of said first and second stages moves, a first driving unit which includes a first mover fixed to said first stage and a first stator fixed to said base, said first driving unit driving said first mover by electromagnetic interaction, a second driving unit which includes a second mover fixed to said second stage and a second stator fixed to said base, said second driving unit driving said second mover by electromagnetic interaction, and a third driving unit which drives said moving member by electromagnetic interaction when at least one of said first and second stages moves.

8. An exposure apparatus according to claim 7, further comprising:

an exposure main body portion to transfer said predetermined pattern by irradiating one of a first and a second substrate held on said first and second stages with said energy beam on exposure;

an alignment portion to detect array coordinates of a divided area formed on a surface of a remaining of said first and second substrates;

a first position detection device to detect a position of said first stage; and a second position detection device to detect a position of said second stage, and said one of said first and second stages is positioned to a transferring position of said predetermined pattern, and said remaining of said first and second stages is positioned with respect to said alignment portion.

9. An exposure apparatus according to claim 8, wherein said first position detection device comprises:

a first optical member fixed to said first stage; and a first interferometer system to detect the position of said first stage by irradiating said first optical member with light and receiving reflected light from said first optical member, and said second position detection device comprises:

a second optical member fixed to said second stage; and a second interferometer system to detect the position of said second stage by irradiating said second optical member with light and receiving reflected light from said second optical member.

10. An exposure apparatus according to claim 8, wherein said exposure main body portion comprises:

a mask stage device to hold and move a mask on which said predetermined pattern is formed and which is irradiated with said energy beam; and a projection optical system to image-form said predetermined pattern with said energy beam via said mask.

11. An exposure apparatus according to claim 10, wherein said mask stage device comprises:

a mask stage to hold and move said mask; and a mask stage base which movably holds said mask stage, said mask stage base moves by a reaction force generated when said mask stage moves.

12. A scanning exposure apparatus comprising:

a mask stage device which has a fine adjustment stage and a coarse adjustment stage to hold a mask, said stage device moving said mask;

a substrate stage device which is separated from said coarse adjustment stage and including a first substrate stage to hold and move a first substrate, and a second substrate stage to hold and move a second substrate;

a projection optical system which is separated from said coarse adjustment stage and projects a pattern of said mask onto one of said first and second substrate stages;

a moving member which moves to cancel out a shift in a center of gravity of said substrate stage device when at least one of said first and second substrate stages moves;

a first driving unit which includes a first mover fixed to said first substrate stage and a first stator, said first driving unit driving said first mover by electromagnetic interaction;

a second driving unit which includes a second mover fixed to said second substrate stage and a second stator, said second driving unit driving said second mover by electromagnetic interaction; and a third driving unit which drives said moving member by electromagnetic interaction when at least one of said first and second stages moves.

13. An exposure apparatus according to claim 12, further comprising a substrate stage reaction force suppressing device to suppress a reaction force generated when at least one of said first and second stages moves.

14. An exposure apparatus according to claim 12, further comprising a suppressing device to keep a center of gravity of said substrate stage from moving which occurs when at least one of said first and second stages moves.

15. An exposure apparatus according to claim 12, further comprising a mask stage reaction force processing device to suppress a reaction force generated when at least one said fine adjustment stage and said coarse adjustment stage moves.

16. An exposure apparatus according to claim 12, further comprising a suppressing device to suppress a shift in a center of gravity of said mask stage device, the shift occurring when at least one of said fine adjustment stage and said coarse adjustment stage moves.

17. An exposure apparatus according to claim 12, further comprising a fine adjustment stage driving unit which is arranged between said fine adjustment stage and said coarse adjustment stage, said fine adjustment stage driving unit driving said fine adjustment stage.

18. An exposure apparatus according to claim 12, further comprising:
   a first alignment device to perform alignment of said first substrate; and
   a second alignment device to perform alignment of said second substrate.

19. An exposure apparatus according to claim 18, further comprising a holding member to hold said projection optical system, said first alignment device, and said second alignment device.

20. An exposure apparatus according to claim 12, further comprising a base member that movably supports said first substrate stage and said second substrate stage.

21. An exposure apparatus according to claim 20, wherein said base member movably supports said moving member.

* * * * *